(12) United States Patent
Gu et al.

(10) Patent No.: US 12,431,479 B2
(45) Date of Patent: Sep. 30, 2025

(54) METHOD OF MANUFACTURING SEMICONDUCTOR PACKAGE

(71) Applicant: SAMSUNG ELECTRONICS CO., LTD., Suwon-si (KR)

(72) Inventors: Jakyoung Gu, Suwon-si (KR); Minsoo Kim, Suwon-si (KR); Jihye Shim, Suwon-si (KR); Kyoungok Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 398 days.

(21) Appl. No.: 18/125,958

(22) Filed: Mar. 24, 2023

(65) Prior Publication Data
US 2024/0038549 A1   Feb. 1, 2024

(30) Foreign Application Priority Data
Jul. 26, 2022 (KR) .................. 10-2022-0092757

(51) Int. Cl.
| | |
|---|---|
| H01L 25/00 | (2006.01) |
| H01L 21/027 | (2006.01) |
| H01L 21/033 | (2006.01) |
| H01L 21/3105 | (2006.01) |
| H01L 21/311 | (2006.01) |
| H01L 21/4757 | (2006.01) |
| H01L 21/48 | (2006.01) |
| H01L 23/498 | (2006.01) |
| H01L 25/10 | (2006.01) |
| H01L 25/065 | (2023.01) |

(52) U.S. Cl.
CPC .......... *H01L 25/50* (2013.01); *H01L 21/0274* (2013.01); *H01L 21/0275* (2013.01); *H01L 21/0332* (2013.01); *H01L 21/31058* (2013.01); *H01L 21/311* (2013.01); *H01L 21/31127* (2013.01); *H01L 21/31133* (2013.01);
(Continued)

(58) Field of Classification Search
CPC . H01L 25/50; H01L 21/0274; H01L 21/0275; H01L 21/0332; H01L 21/311; H01L 21/31127; H01L 21/31133; H01L 21/31144; H01L 21/47573; H01L 21/4846; H01L 23/498; H01L 23/49811; H01L 23/49838
See application file for complete search history.

(56) References Cited

U.S. PATENT DOCUMENTS 6,083,824 A * 7/2000 Tsai .................. H01L 21/76811
257/E21.585
6,884,551 B2   4/2005 Fritze et al.
(Continued)

FOREIGN PATENT DOCUMENTS

KR    20150011207 A  *  1/2015  ......... H01L 21/0274
KR    10-1761914 B1     7/2017

*Primary Examiner* — Joseph C. Nicely
(74) *Attorney, Agent, or Firm* — Sughrue Mion, PLLC

(57) ABSTRACT

A method of manufacturing a semiconductor package includes forming a plurality of conductive patterns on a substrate, forming a photoresist film over the substrate to cover the plurality of conductive patterns, forming a photoresist pattern from the photoresist film by a photolithography process using a photomask that includes a transparent area, a light-shielding area, and a semi-transparent area transmitting only a portion of light incident thereon, wherein the photoresist pattern includes a via hole, which exposes one conductive pattern, and a recessed portion, which has a lower surface exposing a portion of the photoresist pattern, forming a conductive post in the via hole, and removing the photoresist pattern by using a photoresist stripping composition.

20 Claims, 21 Drawing Sheets

(52) U.S. Cl.
CPC .. *H01L 21/31144* (2013.01); *H01L 21/47573* (2013.01); *H01L 21/4846* (2013.01); *H01L 21/4857* (2013.01); *H01L 23/498* (2013.01); *H01L 23/49811* (2013.01); *H01L 23/49838* (2013.01); *H01L 25/105* (2013.01); *H01L 25/0657* (2013.01); *H01L 2225/06548* (2013.01)

(56) References Cited

U.S. PATENT DOCUMENTS

| | | | | |
|---|---|---|---|---|
| 8,426,959 | B2 * | 4/2013 | Park | H01L 25/105 257/690 |
| 8,431,479 | B2 * | 4/2013 | Kim | H01L 21/76879 257/E21.585 |
| 8,592,105 | B2 * | 11/2013 | Jang | G03F 1/50 430/5 |
| 8,957,526 | B2 * | 2/2015 | Chun | H01L 24/03 257/774 |
| 9,559,044 | B2 | 1/2017 | Yang et al. | |
| 9,799,619 | B2 | 10/2017 | Jin et al. | |
| 12,327,819 | B2 * | 6/2025 | Yu | H01L 25/50 |
| 2015/0325497 | A1 * | 11/2015 | Yu | H01L 23/522 438/106 |
| 2016/0351494 | A1 * | 12/2016 | Chen | H01L 25/105 |
| 2020/0118936 | A1 * | 4/2020 | Chu | H01L 24/16 |
| 2020/0135669 | A1 * | 4/2020 | Liang | H01L 24/20 |
| 2021/0028098 | A1 * | 1/2021 | Yoo | H01L 21/486 |
| 2022/0278087 | A1 * | 9/2022 | Wu | H01L 24/16 |

\* cited by examiner

METHOD OF MANUFACTURING SEMICONDUCTOR PACKAGE

CROSS-REFERENCE TO RELATED APPLICATION

This application is based on and claims priority under 35 U.S.C. § 119 to Korean Patent Application No. 10-2022-0092757, filed on Jul. 26, 2022, in the Korean Intellectual Property Office, the disclosure of which is incorporated by reference herein in its entirety.

BACKGROUND

The disclosure relates to a method of manufacturing a semiconductor package, and more particularly, to a method of manufacturing a semiconductor package by using a photoresist pattern.

Photoresist patterns have been used for various purposes in semiconductor package manufacturing processes, and thus, processes of removing photoresist patterns remaining after the use thereof have accompanied the manufacturing processes. In particular, along with the increasing thicknesses of semiconductor chips in semiconductor packages, the thicknesses of photoresist patterns used in semiconductor package manufacturing processes have also increased. As such, after photoresist patterns having relatively high thicknesses are used, because the amount of strip chemical liquids used must be increased to remove the photoresist patterns, there may be drawbacks in terms of unit per equipment hour (UPEH) due to an increase in process time, and there may be adverse effects, such as corrosion or the like, on metal-containing structures around the photoresist patterns.

SUMMARY

The disclosure provides a method of manufacturing a semiconductor package, the method being capable of reducing the amount of a strip chemical liquid used and the process time in removing a photoresist pattern after the use of the photoresist pattern with a relatively high thickness, and the method allowing the productivity and reliability of the semiconductor package to be improved by minimizing a period of time of contact between the strip chemical liquid and a metal-containing structure around the photoresist pattern during the removal of the photoresist pattern, which remains after used, and thus by preventing adverse effects, such as the corrosion of the metal-containing structure.

In accordance with an aspect of the disclosure, a method of manufacturing a semiconductor package includes forming a plurality of conductive patterns on a substrate; forming a photoresist film over the substrate to cover the plurality of conductive patterns; forming a photoresist pattern from the photoresist film by a photolithography process using a photomask that includes a transparent area, a light-shielding area, and a semi-transparent area, wherein the semi-transparent area transmits only a portion of light incident thereon, wherein the photoresist pattern includes a plurality of local patterns respectively having different vertical heights from each other to define: a via hole which exposes one conductive pattern selected from the plurality of conductive patterns, and a recessed portion having a lower surface, which exposes a portion of the photoresist pattern under the lower surface; forming a conductive post only in the via hole without forming the conductive post in the recessed portion; and removing the photoresist pattern by applying a photoresist stripping composition to the photoresist pattern.

In accordance with an aspect of the disclosure, a method of manufacturing a semiconductor package includes preparing a substrate that extends in a horizontal direction and includes a chip mounting area and a connection area surrounding the chip mounting area; forming a plurality of conductive patterns on the substrate in the chip mounting area and the connection area; forming a photoresist film to cover the plurality of conductive patterns in the chip mounting area and the connection area; forming a photoresist pattern from the photoresist film by a photolithography process using a photomask that includes a plurality of transparent areas, a plurality of light-shielding areas, and at least one semi-transparent area, wherein the at least one semi-transparent area transmits only a portion of light incident thereon, wherein the photoresist pattern includes a plurality of local patterns respectively having different vertical heights from each other to define: a plurality of via holes, which are arranged in the connection area and each expose one conductive pattern from among the plurality of conductive patterns, and at least one recessed portion, which is arranged in the chip mounting area and has a lower surface that exposes a portion of the photoresist pattern under the lower surface; forming a plurality of conductive posts respectively only in the plurality of via holes without forming a conductive post in the at least one recessed portion; and removing the photoresist pattern by applying a photoresist stripping composition to the photoresist pattern.

In accordance with an aspect of the disclosure, a method of manufacturing a semiconductor package includes preparing a substrate that extends in a horizontal direction and includes a chip mounting area and a connection area surrounding the chip mounting area; forming a redistribution layer on the substrate in the chip mounting area and the connection area, the redistribution layer including a plurality of conductive patterns; forming a photoresist film on the redistribution layer in the chip mounting area and the connection area to cover the plurality of conductive patterns, the photoresist film including a negative-type photoresist; forming a photoresist pattern from the photoresist film by a photolithography process using a photomask that includes a plurality of transparent areas, a plurality of light-shielding areas, and at least one semi-transparent area, wherein the at least one semi-transparent area transmits only a portion of light incident thereon, wherein the photoresist pattern includes a plurality of local patterns respectively having different vertical heights from each other to define: a plurality of via holes, which are arranged in the connection area and each expose one conductive pattern from among the plurality of conductive patterns, and at least one recessed portion, which is arranged in the chip mounting area and has a lower surface that exposes a portion of the photoresist pattern under the lower surface; forming a plurality of conductive posts respectively only in the plurality of via holes without forming a conductive post in the at least one recessed portion; exposing at least one conductive pattern from among the plurality of conductive patterns in the chip mounting area by removing the photoresist pattern by applying a photoresist stripping composition to the photoresist pattern; and mounting a semiconductor chip on the redistribution layer in the chip mounting area such that the semiconductor chip is electrically connected to the at least one conductive pattern.

BRIEF DESCRIPTION OF DRAWINGS

The above and other aspects, features, and advantages of certain embodiments of the disclosure will be more clearly understood from the following description taken in conjunction with the accompanying drawings, in which.

DETAILED DESCRIPTION OF EMBODIMENTS

Figure 1:
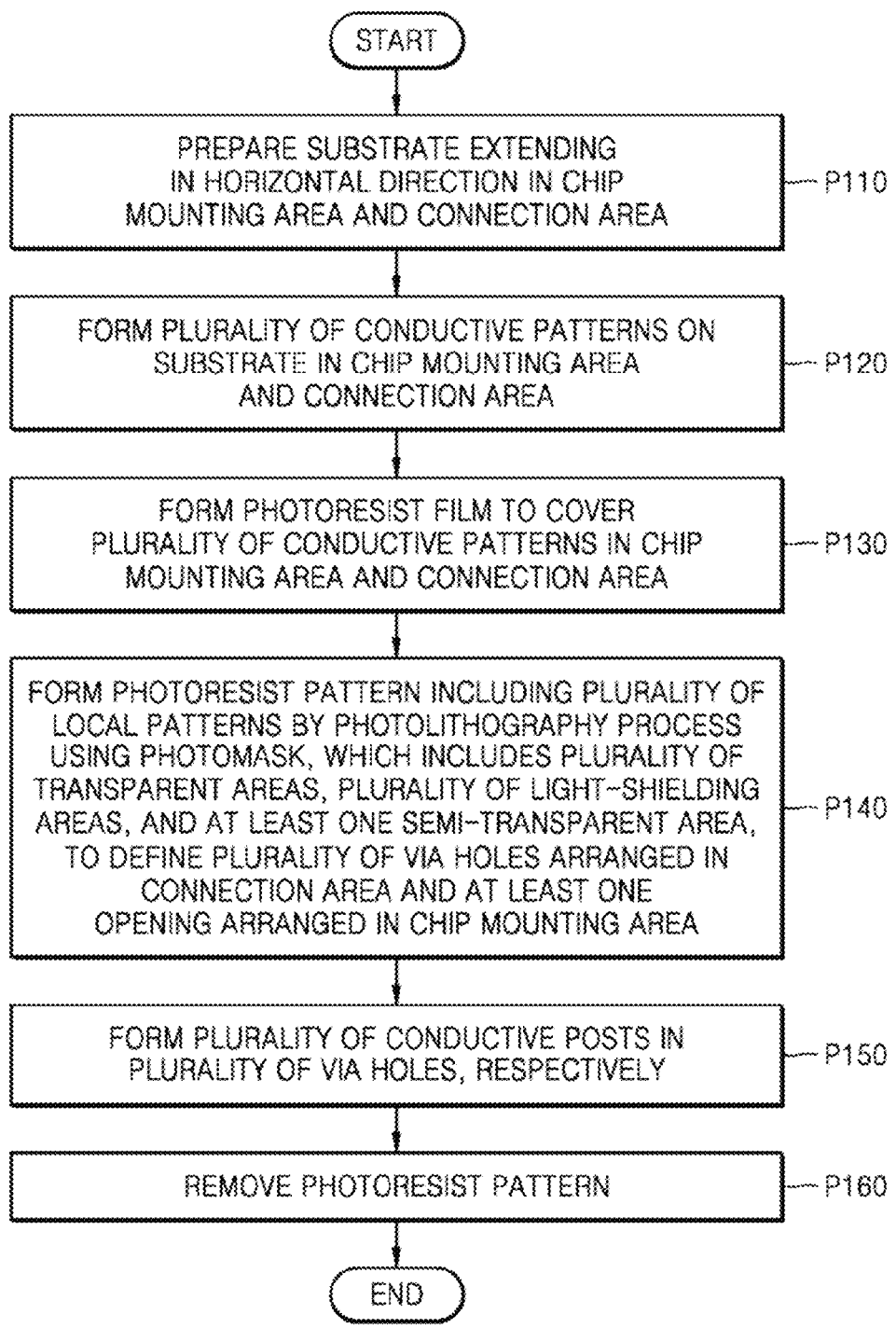
FIG. 1 is a flowchart illustrating a method of manufacturing a semiconductor package, according to at least one embodiment.

Hereinafter, embodiments of the disclosure will be described in detail with reference to the accompanying drawings. Like components are denoted by like reference numerals throughout the specification, and repeated descriptions thereof are omitted.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 2A:
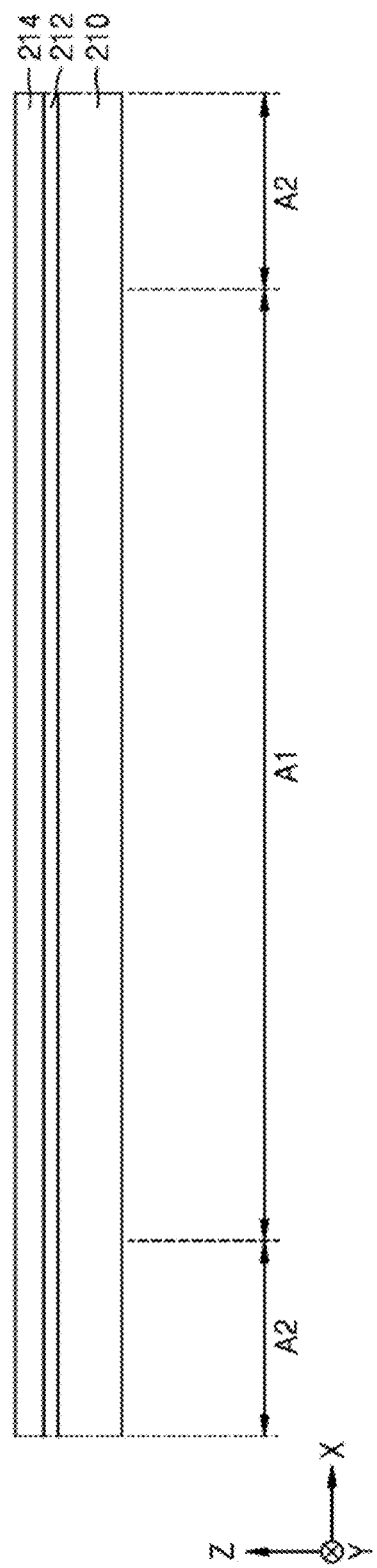
FIGS. 2A to 2N are cross-sectional views respectively illustrating a sequence of processes of a method of manufacturing a semiconductor package, according to at least one embodiment.

FIG. 1 is a flowchart illustrating a method of manufacturing a semiconductor package, according to some embodiments. FIGS. 2A to 2N are cross-sectional views respectively illustrating a sequence of processes of a method of manufacturing a semiconductor package, according to some embodiments. The method of manufacturing a semiconductor package, according to some embodiments, will be described with reference to FIG. 1 and FIGS. 2A to 2N.

In process P110 of FIG. 1, a substrate, which extends in a horizontal direction in a chip mounting area and a connection area surrounding the chip mounting area, may be prepared.

In process P110 of FIG. 1, a carrier substrate 210 shown in FIG. 2A may be prepared as the substrate. In some embodiments, the carrier substrate 210 may include glass, polyimide, poly(etheretherketone) (PEEK), poly(ethersulfone) (PES), poly(phenylene sulfide) (PPS), or the like.

In some embodiments, in process P110 of FIG. 1, the substrate may include a semiconductor substrate. The semiconductor substrate may include, but is not limited to, a semiconductor element, such as silicon (Si) or germanium (Ge), or a compound semiconductor, such as silicon carbide (SiC), gallium arsenide (GaAs), indium arsenide (InAs), or indium phosphide (InP).

As shown in FIG. 2A, a release film 212 and a cover layer 214 may be sequentially stacked on the carrier substrate 210 in the stated order. The release film 212 may include a laser reaction layer configured to separate the carrier substrate 210 by vaporizing in reaction to laser irradiation in a subsequent process. In some embodiments, the release film 212 may include a carbon-containing film. For example, the release film 212 may include an amorphous carbon layer (ACL) or a spin-on hardmask (SOH) film. The SOH film may include a hydrocarbon compound or a derivative thereof including carbon atoms in an amount of about 85% by weight (wt %) to about 99 wt %. The cover layer 214 may include photosensitive polyimide, oxide, nitride, or a combination thereof.

Figure 3A:
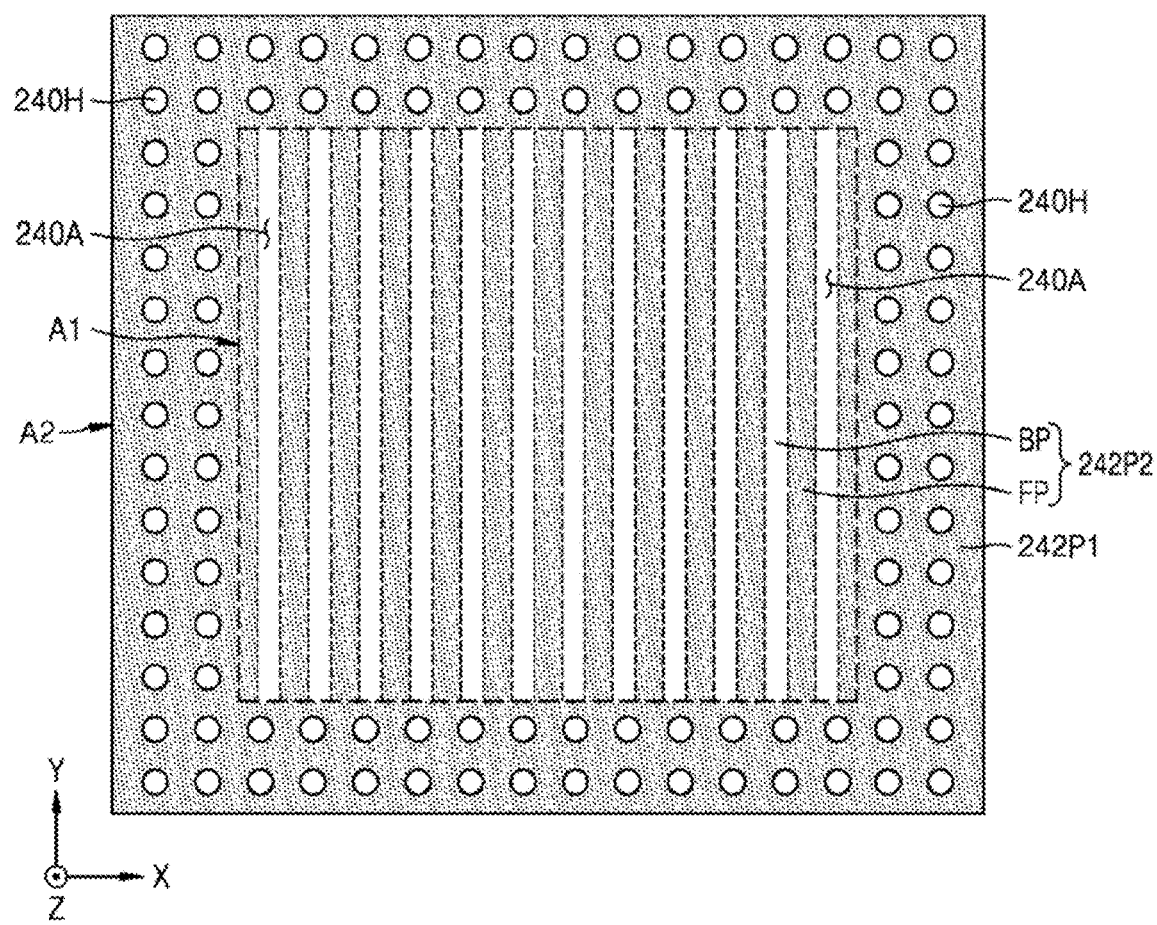
FIGS. 3A and 3B are each a plan view illustrating an example of a planar structure of an edge local pattern and a center local pattern of a semiconductor package manufactured according to at least one embodiment.

The carrier substrate 210 may extend in a horizontal direction (e.g., a direction along an X-Y plane in FIG. 2A) in a chip mounting area A1, in which a semiconductor chip is mounted, and a connection area A2 surrounding the chip mounting area A1, in a semiconductor package intended to be formed. The chip mounting area A1 may have a planar shape of a rectangle, as shown in FIG. 3A. The connection area A1 may be an area having a planar shape of a rectangular ring surrounding the chip mounting area A1, as shown in FIG. 3A.

In process P120 of FIG. 1, a plurality of conductive patterns may be formed on the substrate in the chip mounting area and the connection area.

Figure 2B:
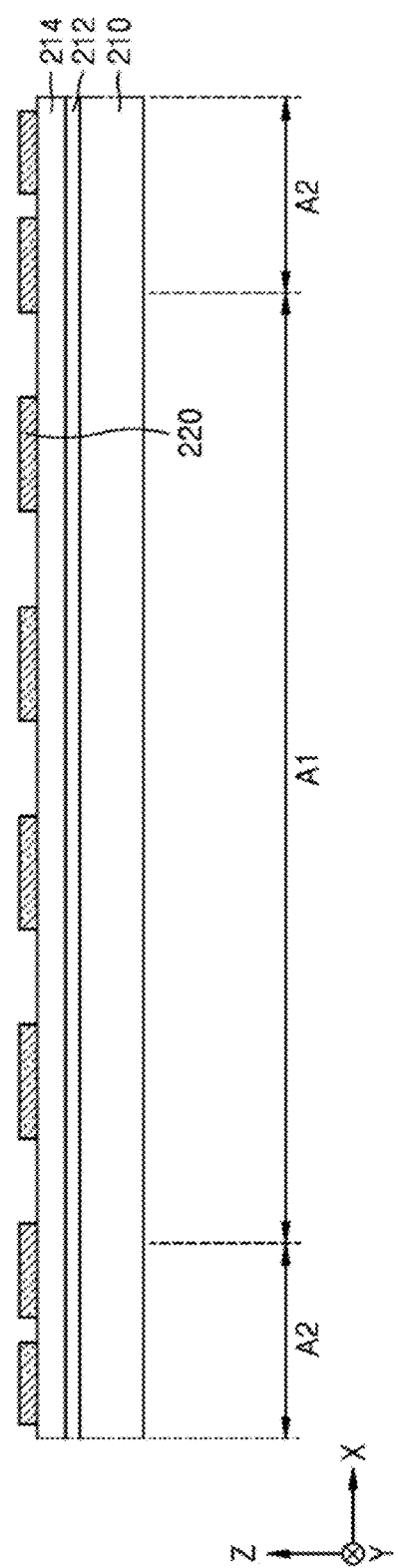
Figure 2C:
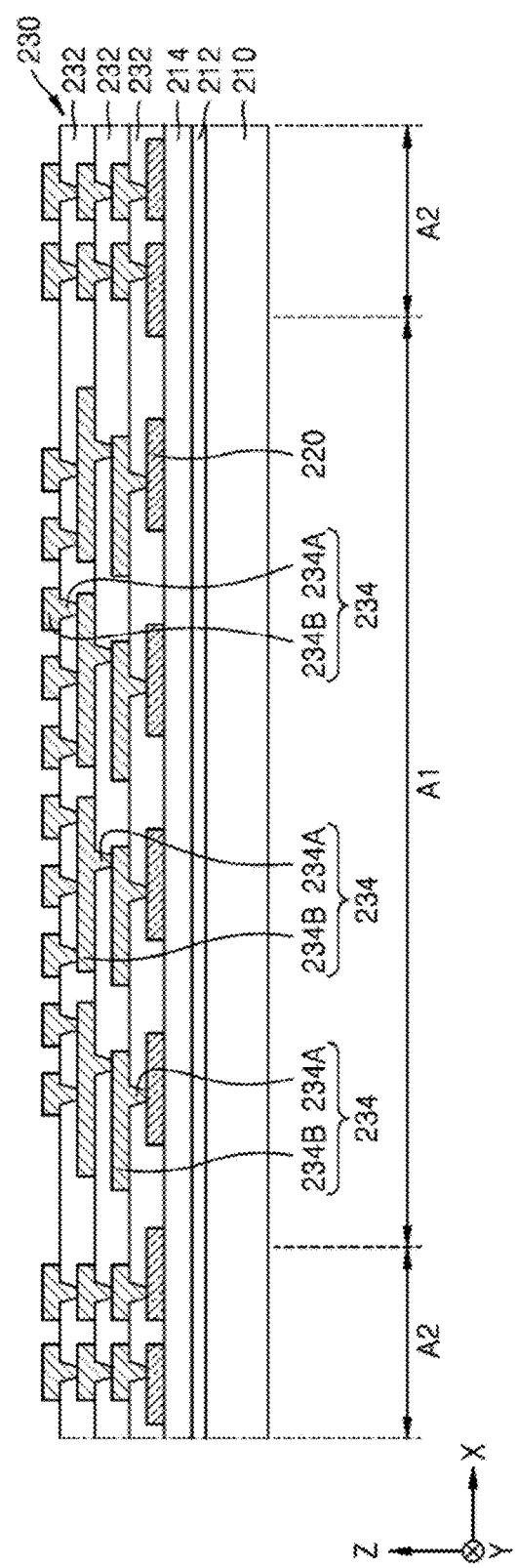

In some embodiments, to form the plurality of conductive patterns in process P120 of FIG. 1, processes shown in FIGS. 2B and 2C may be performed.

More specifically, first, a plurality of external electrode pads 220 may be formed on the cover layer 214 in the chip mounting area A1 and the connection area A2 of a resulting product of FIG. 2A, as shown in FIG. 2B.

Each of the plurality of external electrode pads 220 may function as an under bump metallurgy (UBM) connected to an external connection terminal, for example, an external connection terminal 290 shown in FIG. 2N. The external electrode pad 220 may include, but is not limited to, a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof.

In some embodiments, each of the plurality of external electrode pads 220 may include a single metal material. In some embodiments, the external electrode pad 220 may have a multilayered structure in which layers respectively include different metal materials from each other. To form the plurality of external electrode pads 220, a conductive material film may be formed on the cover layer 214 and then patterned.

Referring to FIG. 2C, a lower redistribution structure 230 may be formed on a resulting product of FIG. 2B. The lower redistribution structure 230 may be arranged throughout the chip mounting area A1 and the connection area A2.

The lower redistribution structure 230 may include a plurality of insulating films 232, which are stacked in a vertical direction (Z direction), and a plurality of lower redistribution patterns 234, each passing through one of the plurality of insulating films 232. The plurality of lower redistribution patterns 234 may include a plurality of conductive via patterns 234A and a plurality of conductive line patterns 234B. A plurality of conductive via patterns 234A may be respectively connected to some of the plurality of conductive line patterns 234B in the vertical direction. The plurality of conductive via patterns 234A may be insulated from some others of the plurality of conductive line patterns 234B by the plurality of insulating films 232.

In some embodiments, each of the plurality of insulating films 232 may include, but is not limited to, photosensitive polyimide (PSPI), silicon oxide, or silicon nitride.

In some embodiments, each of the plurality of lower redistribution patterns 234 may include copper (Cu), titanium (Ti), titanium tungsten (TiW), titanium nitride (TiN), tantalum (Ta), tantalum nitride (TaN), chromium (Cr), aluminum (Al), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or a combination thereof. In some embodiments, the plurality of lower redistribution patterns 234 may be formed by an electroless plating process, but the disclosure is not limited thereto.

Although FIG. 2C illustrates that the lower redistribution structure 230 includes three insulating films 232, which are stacked in the vertical direction (Z direction), and the plurality of lower redistribution patterns 234 having a three-layer structure, the disclosure is not limited thereto. The number of stacked layers for each of the insulating film 232 and the lower redistribution pattern 234 may be variously changed according to the design of circuit wiring lines included in the lower redistribution structure 230. Herein, each lower redistribution pattern 234 of the plurality of lower redistribution patterns 234 included in the lower redistribution structure 230 may be referred to as a conductive pattern.

In process P130 of FIG. 1, a photoresist film may be formed to cover the plurality of conductive patterns in the chip mounting area and the connection area.

Figure 2D:
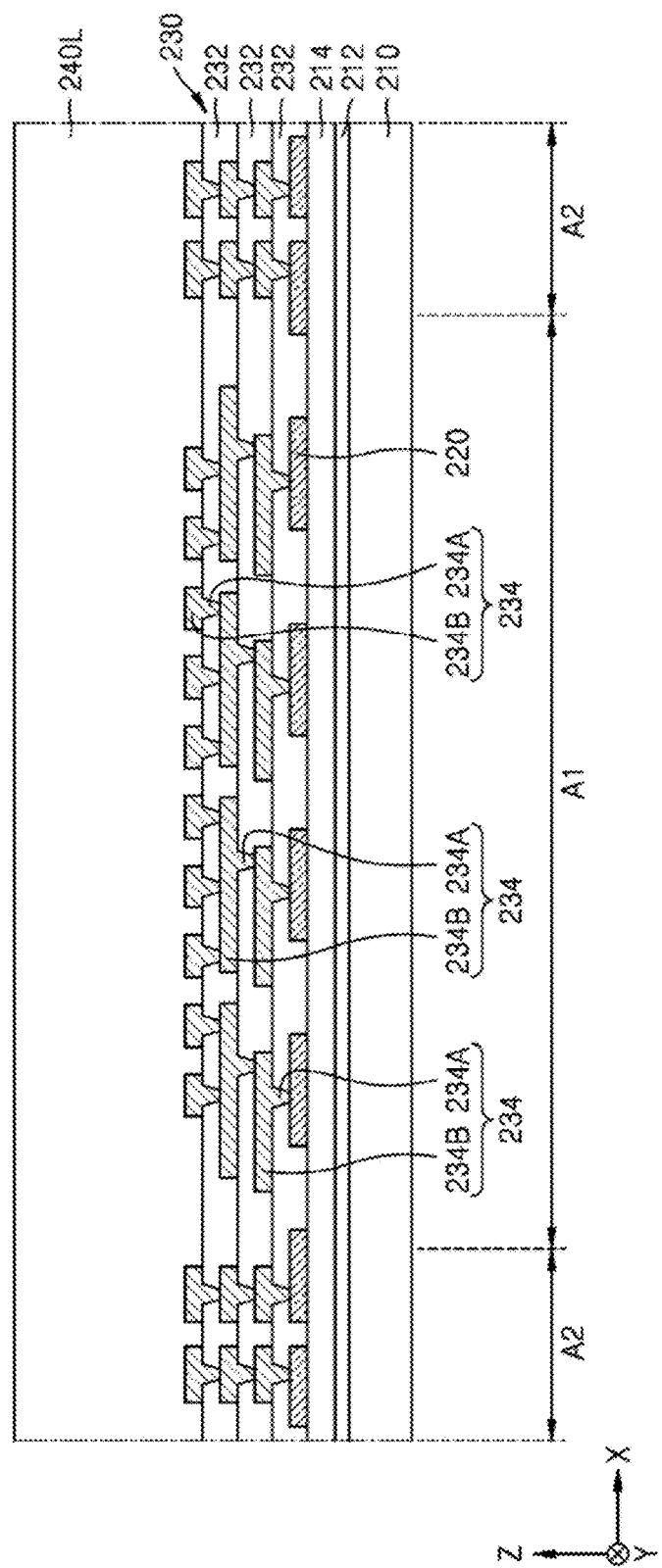

In some embodiments, to perform process P130 of FIG. 1, a photoresist film 240L may be formed to cover the lower redistribution structure 230 in the chip mounting area A1 and the connection area A2, as shown in FIG. 2D.

In some embodiments, the photoresist film 240L may have a relatively high thickness ranging from tens of μm to hundreds of μm. In an example, the photoresist film 240L may have a thickness of about 50 μm to about 400 μm. In an example, the photoresist film 240L may have a thickness of about 100 μm to about 300 μm.

The photoresist film 240L may include a positive-type photoresist or a negative-type photoresist. In some embodiments, the photoresist film 240L may include a negative-type photoresist.

In some embodiments, when the photoresist film 240L includes a negative-type photoresist, the photoresist film 240L may include a base-soluble resin (binder resin), which is based on a (meth)acrylate copolymer, a styrene copolymer, a novolac resin, or the like, a crosslinking agent, and a photo-radical generator. When the photoresist film 240L is exposed in a subsequent process, the photo-radical generator in the photoresist film 240L may generate reactive radicals, and thus, cause a crosslinking reaction in an exposed region of the photoresist film 240L. Accordingly, the exposed region of the photoresist film 240L may be insoluble in a developer.

In process P140 of FIG. 1, a photoresist pattern may be formed from the photoresist film by a photolithography process using a photomask, which includes a plurality of transparent areas, a plurality of light-shielding areas, and at least one semi-transparent area. The at least one semi-transparent area may transmit only a portion of light incident thereon.

Figure 2E:
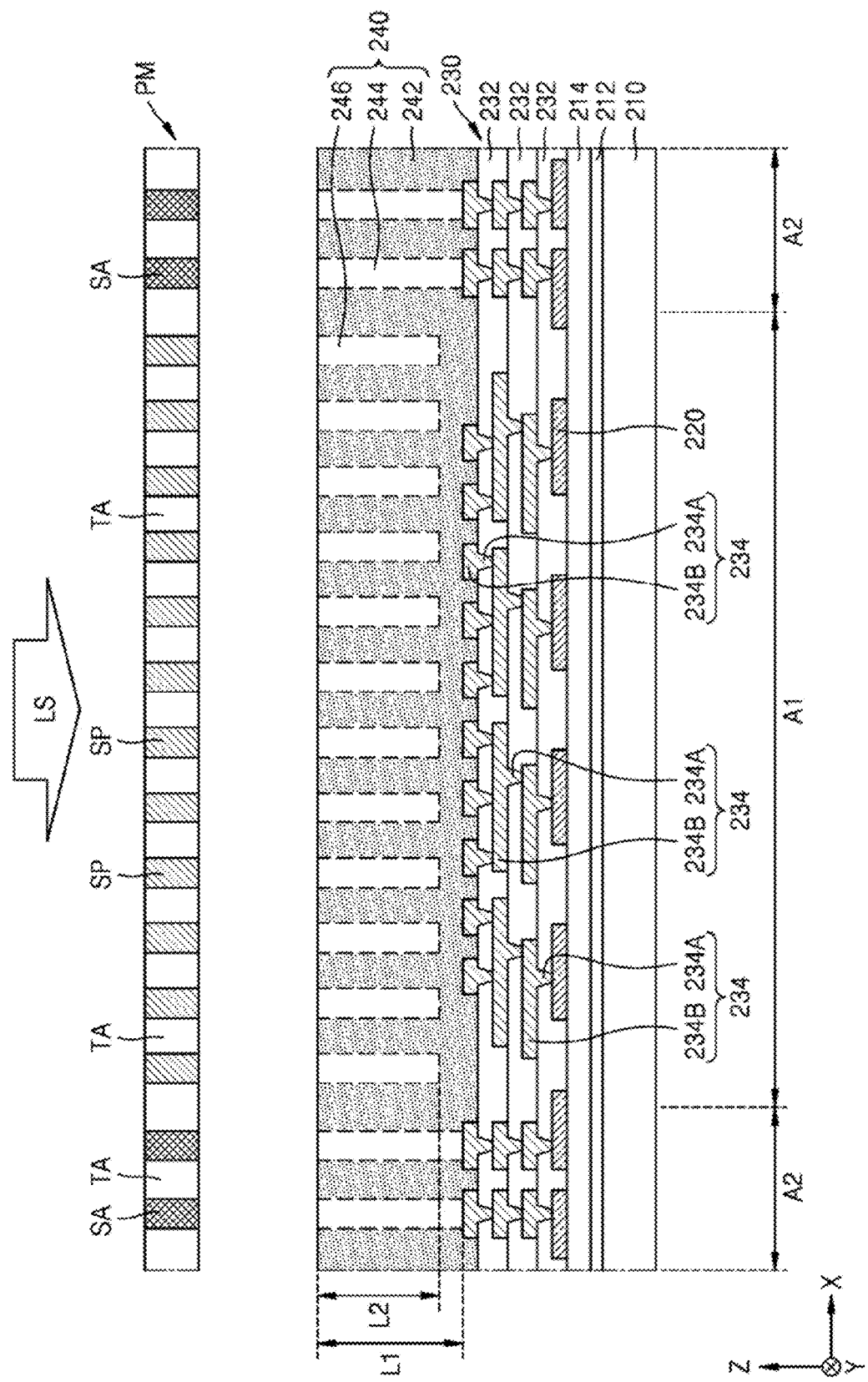
Figure 2F:
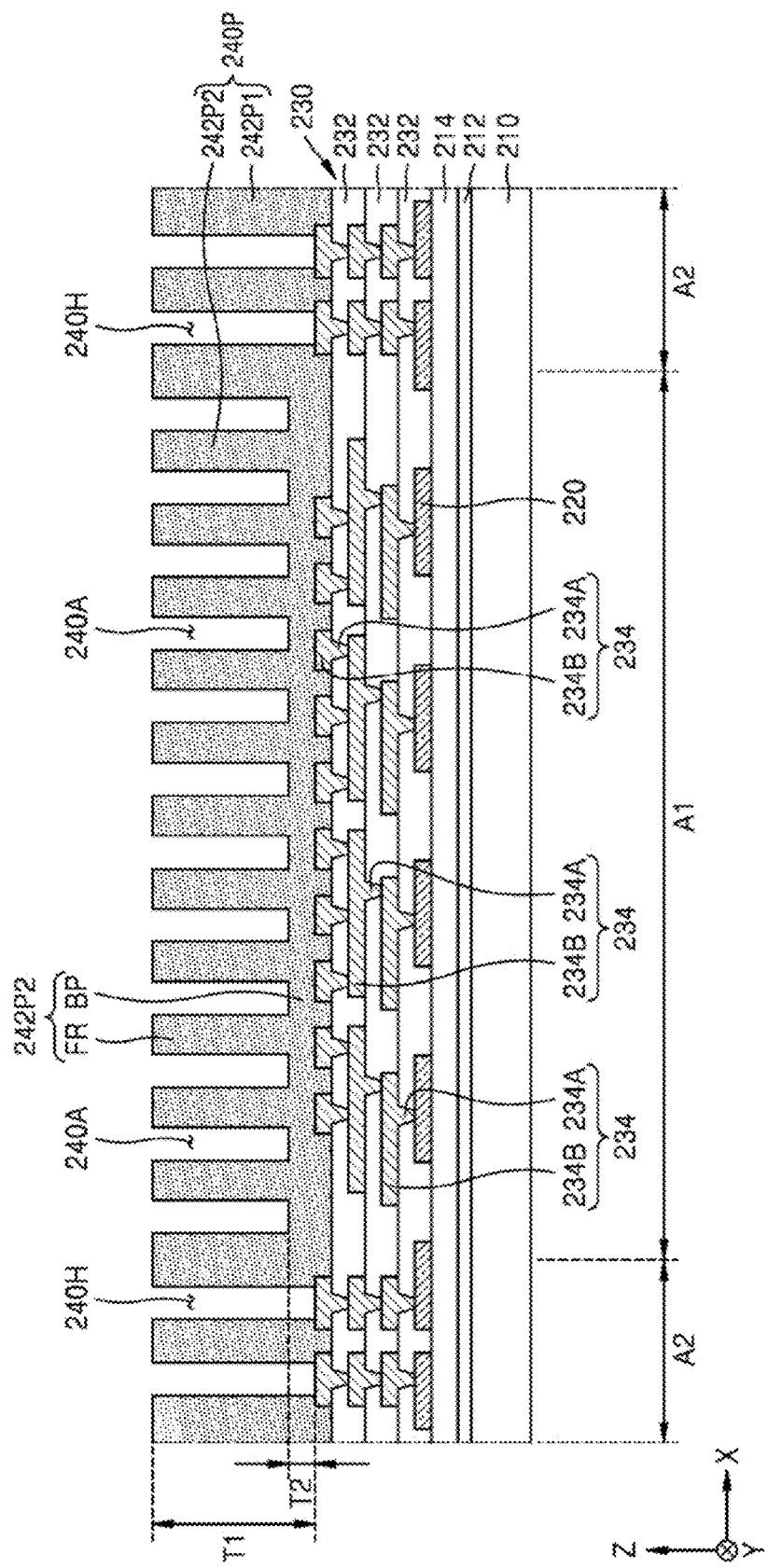

In some embodiments, to form the photoresist pattern according to process P140 of FIG. 1, processes shown in FIGS. 2E and 2F may be performed.

More specifically, first, the photoresist film 240L of a resulting product of FIG. 2D may be exposed by using a photomask PM, which includes a plurality of transparent areas TA, a plurality of light-shielding areas SA, and a plurality of semi-transparent areas SP that each transmit only a portion of light incident thereon, as shown in FIG. 2E.

To expose the photoresist film 240L, the photoresist film 240L may be irradiated with light from a light source LS through the photomask PM. The light source LS may emit i-line (365 nm) light, 248 nm light, 193 nm light, extreme ultraviolet light, or an electron beam. For example, the light source LS may emit light having a wavelength of about 330 nm to about 440 nm, but the disclosure is not limited thereto.

In exposing the photoresist film 240L, the photoresist film 240L in the chip mounting area A1 may be exposed by using light that is emitted from the light source LS and passes through some transparent areas TA, which are selected from the plurality of transparent areas TA in the photomask PM, and the plurality of semi-transparent areas SP in the photomask PM. The photoresist film 240L in the connection area A2 may be exposed by using light that is emitted from the light source LS and passes through some other transparent areas TA, which are selected from the plurality of transparent areas TA in the photomask PM.

In some embodiments, the plurality of light-shielding areas SA in the photomask PM may be aligned with a portion of the photoresist film 240L, which is only in the connection area A2 from among the chip mounting area A1 and the connection area A2. In some embodiments, the plurality of semi-transparent areas SP in the photomask PM may be aligned with another portion of the photoresist film 240L, which is only in the chip mounting area A1 from among the chip mounting area A1 and the connection area A2. In other words, the plurality of light-shielding areas SA may be aligned with the connection area A2 and may not be aligned with the chip mounting area A1, while the plurality of semi-transparent areas SP may be aligned with the chip mounting area A1 and may not be aligned with the connection area A2.

In some embodiments, each of the plurality of transparent areas TA in the photomask PM may include a transparent substrate. The transparent substrate may include quartz.

In some embodiments, each of the plurality of light-shielding areas SA in the photomask PM may include a material that shields light. For example, each of the plurality of light-shielding areas SA may include chromium (Cr), chromium oxide, or a combination thereof.

Each of the plurality of semi-transparent areas SP in the photomask PM may include a material capable of transmitting only a portion of light emitted from the light source LS. In some embodiments, the light transmittance of each of the plurality of semi-transparent areas SP may be about 10% to about 90% of the light emitted from the light source LS. For example, the light transmittance of each of the plurality of semi-transparent areas SP may be about 10% to about 55%, about 10% to about 50%, or about 10% to about 45%. By appropriately controlling the light transmittance of each of the plurality of semi-transparent areas SP, phase characteristics of transmitted light, or the like, a plurality of local patterns respectively having different heights from each other may be formed such that an upper surface of a portion of an exposed photoresist film 240 in the chip mounting area A1 has steps, and the thicknesses of portions, cross-sectional shapes, and the like of the plurality of local patterns may be variously controlled.

In some embodiments, each of the plurality of semi-transparent areas SP in the photomask PM may include a gray-tone mask region including a plurality of fine slit patterns stacked on the transparent substrate. The plurality of fine slit patterns constituting the gray-tone mask region may be configured to adjust the amount of transmitted light by using diffraction of light passing through the plurality of fine slit patterns.

In some embodiments, each of the plurality of semi-transparent areas SP in the photomask PM may include a halftone layer stacked on the transparent substrate. The halftone layer may transmit only a portion of light emitted from the light source LS.

Each of the plurality of semi-transparent areas SP in the photomask PM may include a semi-transparent material layer. The semi-transparent material layer may include at least one material selected from Mo, Si, Ta, W, Al, Cr, Hf, Zr, Me, V, Ni, Nb, Co, Ti, oxides thereof, nitrides thereof, and carbides thereof. For example, the semi-transparent material layer may include, but is not limited to, $Cr_xO_y$, $Cr_xCO_y$, $Cr_xO_yN_z$, $Si_xO_y$, $Si_xO_yN_z$, $Si_xCO_y$, $Si_xCO_yN_z$, $Mo_xSi_y$, $Mo_xO_y$, $Mo_xO_yN_z$, $Mo_xCO_y$, $Mo_xO_yN_z$, $Mo_xSi_yO_z$, $Mo_xSi_yO_zN$ $Mo_xSi_yCO_zN$, $Mo_xSi_yCO_z$, $Ta_xO_y$, $Ta_xO_yN_z$, $Ta_xCO_y$, $Ta_xO_yN_z$, $Al_xO_y$, $Al_xCO_y$, $Al_xO_yN_z$, $Al_xCO_yN_z$, $Ti_xO_y$, $Ti_xO_yN_z$, $Ti_xCO_y$, or a combination thereof (where the subscripts x, y, and z are each a natural number).

Although FIG. 2E illustrates an example of exposing the photoresist film 240L (see FIG. 2D) by using one photomask PM, the disclosure is not limited thereto. For example, the exposed photoresist film 240 may be formed by at least two exposure processes using at least two photomasks, each including at least one transparent area and at least one semi-transparent area, which have different configurations from each other in an area corresponding to the chip mounting area A1. The exposed photoresist film 240 obtained through such a process may be developed as described below, thereby forming the plurality of local patterns respectively having different heights from each other such that the upper surface of the portion of the exposed photoresist film 240, which is in the chip mounting area A1, has steps.

In some embodiments, after the exposure process described with reference to FIG. 2E is performed, the exposed photoresist film 240 may be heat-treated. By heat-treating the exposed photoresist film 240, the resolution after a development process, or a process margin of a development condition may be improved. To heat-treat the exposed photoresist film 240, an oven, a hotplate, an infrared ray, a flash lamp annealing device, a laser annealing device, or the like may be used. The heat treatment of the exposed photoresist film 240 may be performed at a temperature of about 50° C. to about 180° C., for example, about 60° C. to about 150° C. The heat treatment of the exposed photoresist film 240 may be performed for about 10 seconds to several hours.

As shown in FIG. 2E, the exposed photoresist film 240 may include a plurality of local exposed regions 242 arranged in the chip mounting area A1 and the connection area A2, a plurality of first local non-exposed regions 244 arranged in the connection area A2, and a plurality of second local non-exposed regions 246 arranged in the chip mounting area A1. The plurality of first local non-exposed regions 244 may extend by a first length L1 in the vertical direction (Z direction) from an upper surface of the exposed photoresist film 240 in the connection area A2. A lower surface of each of the plurality of first local non-exposed regions 244 may contact an upper surface of one lower redistribution pattern 234 selected from the plurality of lower redistribution patterns 234. The plurality of second local non-exposed regions 246 may extend by a second length L2, which is less than the first length L1, in the vertical direction (Z direction) from the upper surface of the exposed photoresist film 240 in the chip mounting area A1. A lowermost portion of each of the plurality of second local non-exposed regions 246 may be apart from the lower redistribution pattern 234 in the vertical direction (Z direction) with some of the plurality of local exposed regions 242 in the exposed photoresist film 240 therebetween.

Referring to FIG. 2F, in a resulting product of FIG. 2E, a photoresist pattern 240P may be formed by removing the plurality of first local non-exposed regions 244 and the plurality of second local non-exposed regions 246 from the exposed photoresist film 240 by developing the exposed photoresist film 240. The photoresist pattern 240P (after being developed) may include a plurality of local patterns respectively having inconsistent vertical heights. As used herein, the terms "vertical length" and "vertical height" may both refer to a distance in the vertical direction (Z direction).

The plurality of local patterns included in the photoresist pattern 240P may define a plurality of via holes 240H, which are arranged in the connection area A2, and a plurality of openings 240A (e.g., a plurality of recessed portions), which are arranged in the chip mounting area A1.

In the photoresist pattern 240P, a vertical length of each of the plurality of openings 240A may be less than a vertical length of each of the plurality of via holes 240H. An aspect ratio of each of the plurality of via holes 240H in the photoresist pattern 240P may be greater than 1. In some embodiments, the aspect ratio of each of the plurality of via holes 240H may be, but is not limited to, about 3 to about 20.

Each of the plurality of via holes 240H may have a first lower surface that exposes one lower redistribution pattern 234 selected from the plurality of lower redistribution patterns 234. Each of the plurality of openings 240A may have a second lower surface that exposes a portion of the photoresist pattern 240P.

The plurality of local patterns in the photoresist pattern 240P may include an edge local pattern 242P1, which is arranged in the connection area A2 and defines each of the plurality of via holes 240H in the horizontal direction (for example, the X direction or the Y direction in FIG. 2F), and a center local pattern 242P2, which is arranged in the chip mounting area A1 and covers at least one selected from the plurality of lower redistribution patterns 234.

As shown in FIG. 2F, the center local pattern 242P2 may include a bottom portion BP, which covers at least one selected from the plurality of lower redistribution patterns 234 in the chip mounting area A1, and a plurality of fin patterns FP, which extend in a direction away from the plurality of lower redistribution patterns 234 in the vertical direction (Z direction) from the bottom portion BP.

The photoresist pattern 240P may have a first thickness T1 selected from within a range of about 50 μm to about 400 μm. The bottom portion BP corresponding to a portion of the photoresist pattern 240P, which is exposed at the second lower surface of each of the plurality of openings 240A of the photoresist pattern 240P, may have a second thickness T2 that is less than the first thickness T1 of the photoresist pattern 240P.

Figure 3B:
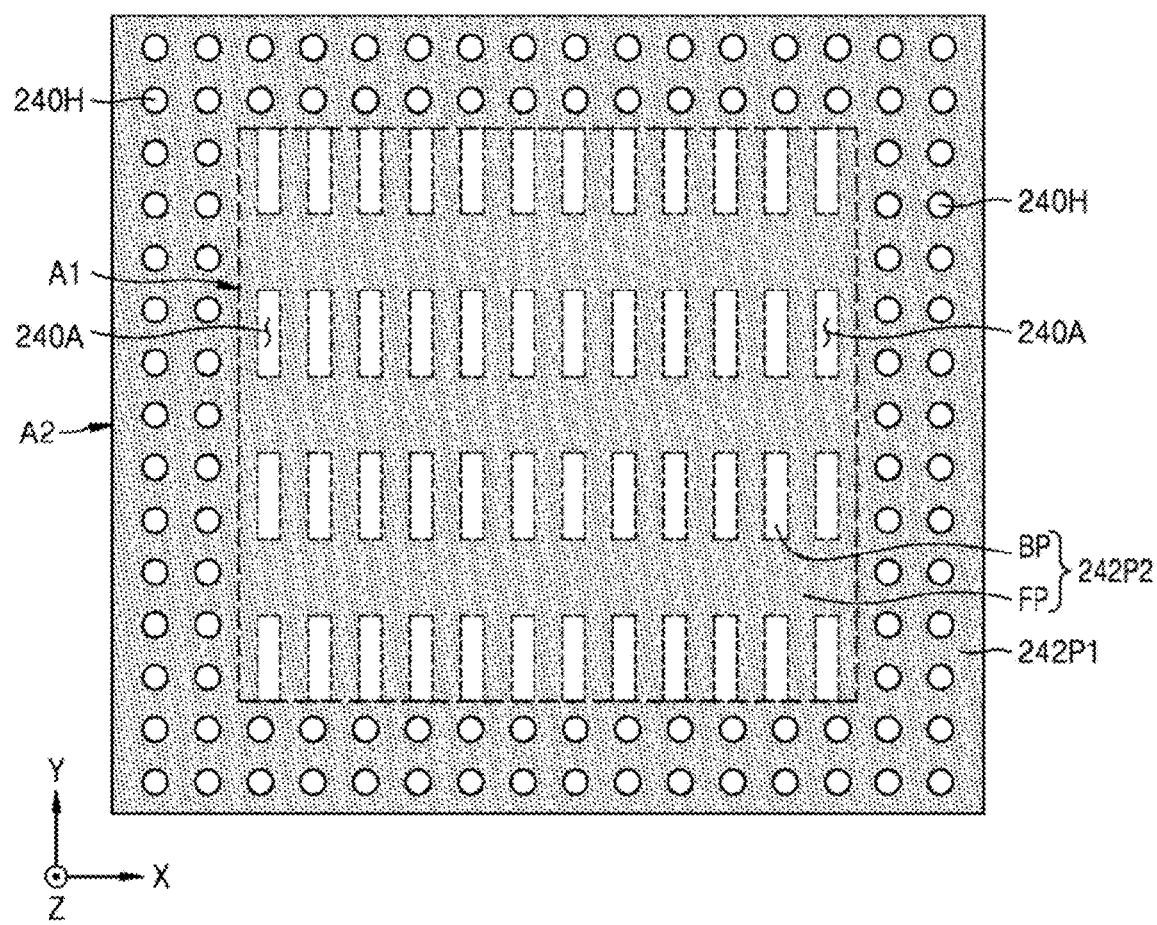

FIGS. 3A and 3B are each a plan view illustrating an example of a planar structure of the edge local pattern 242P1 and the center local pattern 242P2. The edge local pattern 242P1 and the center local pattern 242P2, shown in FIG. 2F, may have a planar configuration shown in FIG. 3A or 3B.

Referring to FIG. 3A, the edge local pattern 242P1 may have a planar shape that defines the width of each of the plurality of via holes 240H in the horizontal direction (for example, the X direction or the Y direction in FIG. 3A) in the connection area A2. The plurality of fin patterns FP in the center local pattern 242P2 may include a plurality of line patterns, which are arranged parallel to each other in the chip mounting area A1 to extend lengthwise in the horizontal direction (Y direction in FIGS. 2F and 3A) along a straight line. The plurality of openings 240A may be arranged one-by-one between the plurality of fin patterns FP, and some regions of the bottom portion BP of the center local pattern 242P2 may be exposed by each opening 240A between the plurality of fin patterns FP.

Referring to FIG. 3B, the edge local pattern 242P1 may have a planar shape that defines the width of each of the plurality of via holes 240H in the horizontal direction (for example, the X direction or the Y direction in FIG. 3B) in the connection area A2. The plurality of fin patterns FP in the center local pattern 242P2 may have a lattice-like planar shape defining the plurality of openings 240A in the chip mounting area A1. Some regions of the bottom portion BP of the center local pattern 242P2 may be exposed by each opening 240A between the plurality of fin patterns FP.

Referring again to FIG. 2F, to form the photoresist pattern 240P, the exposed photoresist film 240 shown in FIG. 2E may be developed by using a developer. In some embodiments, the developer may include an organic alkaline solution or an aqueous solution of an alkaline compound.

In some embodiments, the developer may include 2-aminoethanol, 2-(dimethylamino)ethanol, 2-(diethylamino)ethanol, diethanolamine, methylamine, ethylamine, dimethylamine, diethylamine, triethylamine, (2-dimethylamino)ethyl acetate, (2-dimethylamino)ethyl (meth)acrylate, cyclohexylamine, ethylenediamine, hexamethylenediamine, ammonia, tetramethylammonium hydroxide (TMAH), tetraethylammonium hydroxide, sodium hydroxide, potassium hydroxide, magnesium hydroxide, calcium hydroxide, barium hydroxide, sodium carbonate, or potassium carbonate. For example, the alkaline developer may include, but is not limited to, TMAH or tetraethylammonium hydroxide.

In some embodiments, the developer may include an organic solvent. The organic solvent may include, but is not limited to, N-methyl-2-pyrrolidone, dimethyl sulfoxide, N,N-dimethylformamide, γ-butyrolactone, ethyl acetate, ethyl pyruvate, ethyl 3-methoxypropionate, ethyl 3-ethoxypropionate, hexamethylphosphotriamide, or a combination thereof.

In some embodiments, to develop the exposed photoresist film 240 (see FIG. 2E), a paddle development process, a spray development process, or a dip development process may be used. After the exposed photoresist film 240 is developed, an obtained resulting product may be cleaned with a rinse liquid. Water, aqueous solutions of alcohols such as ethanol or isopropyl alcohol, aqueous solutions of esters such as propylene glycol monomethyl ether acetate, aqueous solutions of acidic compounds such as carbonic acid gas, hydrochloric acid, or acetic acid, or organic solvents may be used as the rinse liquid.

In process P150 of FIG. 1, a plurality of conductive posts may be respectively formed in the plurality of via holes, which are included in the photoresist pattern formed in process P140. In some embodiments, to form the plurality of conductive posts according to process P150 of FIG. 1, a process described with reference to FIG. 2G may be performed.

Figure 2G:
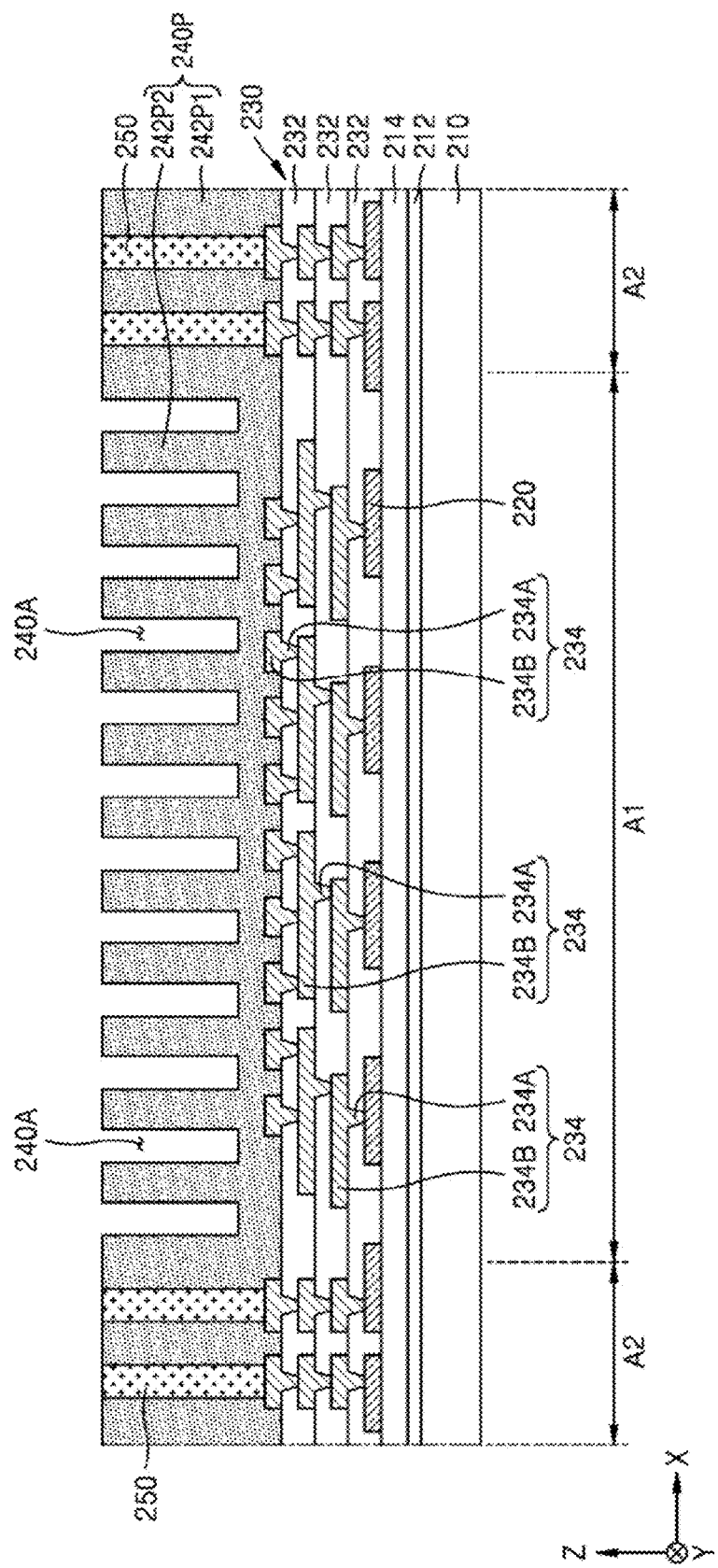

Referring to FIG. 2G, in a resulting product of FIG. 2F, a plurality of conductive posts 250 may be formed respectively only in the plurality of via holes 240H among the plurality of via holes 240H and the plurality of openings 240A, which are included in the photoresist pattern 240P. In other words, the conductive posts 250 may be formed in the via holes 240H and may not be formed in the openings 240A.

Each of the plurality of conductive posts 250 may include, but is not limited to, copper (Cu). In some embodiments, to form the plurality of conductive posts 250, an electroplating process may be performed by using, as a seed layer, the plurality of lower redistribution patterns 234 exposed by the plurality of via holes 240H.

In process P160 of FIG. 1, the photoresist pattern may be removed from a resulting product in which the plurality of conductive posts are formed. In some embodiments, to remove the photoresist pattern according to process P160 of FIG. 1, processes described with reference to FIGS. 2H and 2I may be performed.

Figure 2H:
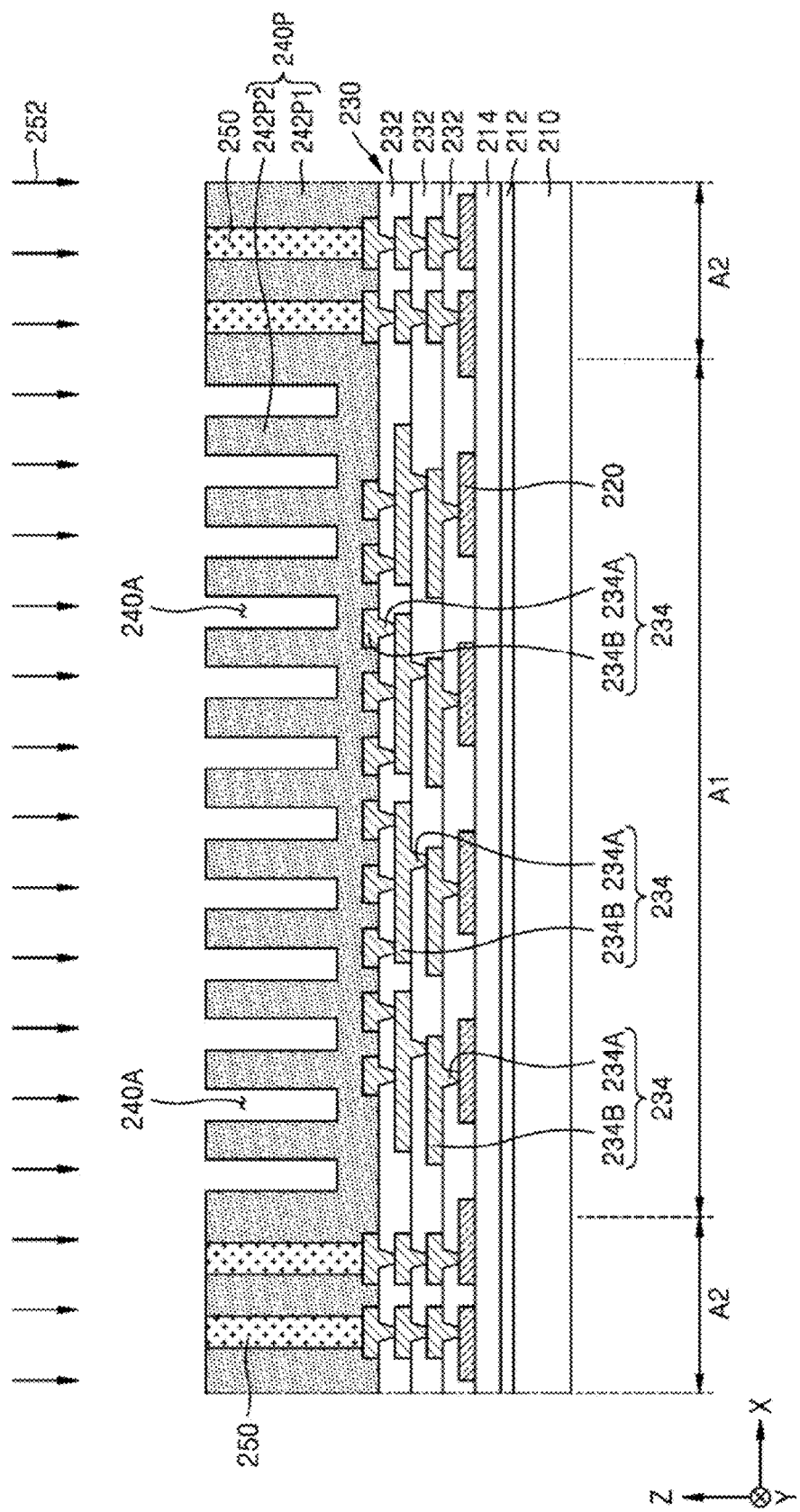

Referring to FIG. 2H, to remove the photoresist pattern 240P, a photoresist stripping composition 252 may be applied to the photoresist pattern 240P.

In some embodiments, the photoresist stripping composition 252 may include a composition, which includes a polar organic solvent, alkyl ammonium hydroxide, an aliphatic amine containing no hydroxyl group, and alcohol. In some embodiments, the photoresist stripping composition 252 may include a composition, which includes dimethyl sulfoxide, a polar organic solvent, alkyl ammonium hydroxide, and an amine containing no hydroxyl group. In some embodiments, the photoresist stripping composition 252 may include a composition, which includes alkyl ammonium hydroxide, alkylene glycol ether, a glycol ether compound, a corrosion inhibitor, and water. However, according to the disclosure, the photoresist stripping composition 252 is not limited to the examples set forth above, and various modifications and changes may be made thereto without departing from the scope of the disclosure. To apply the photoresist stripping composition 252 to the photoresist pattern 240P, a process, such as dipping, spin coating, or spray coating, may be used, but the disclosure is not limited thereto.

Figure 2I:
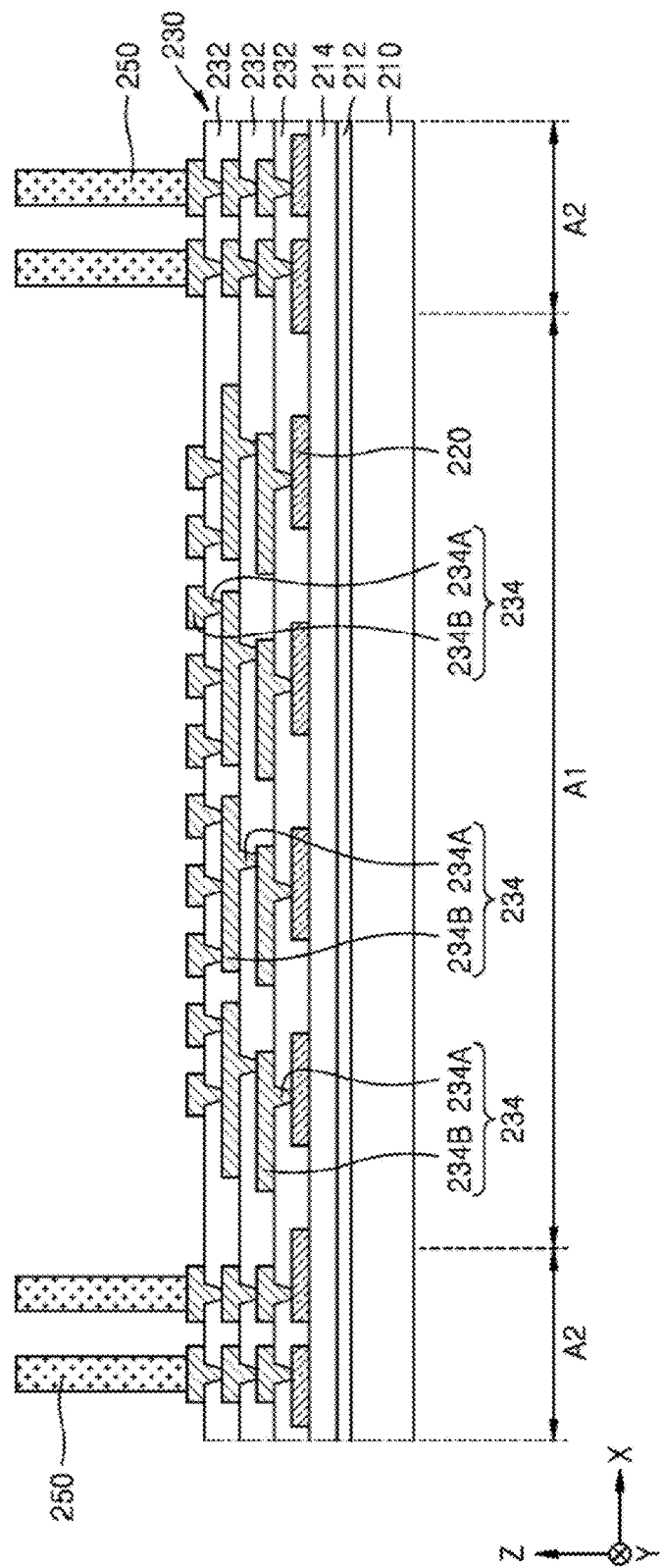

FIG. 2I illustrates a resulting product obtained by removing the photoresist pattern 240P by applying the photoresist stripping composition 252 to the photoresist pattern 240P, as described with reference to FIG. 2H. After the photoresist pattern 240P is removed, each conductive post 250 may be exposed in the connection area A2, and the plurality of lower redistribution patterns 234 may be exposed in the chip mounting area A1.

The resulting product obtained by removing the photoresist pattern 240P may be cleaned. The cleaning may be performed by using deionized water. By the cleaning, a decomposition result product of the photoresist pattern 240P may be cleanly removed from exposed surfaces over the carrier substrate 210.

As described with reference to FIG. 2F, because the photoresist pattern 240P includes the center local pattern 242P2 having the plurality of openings 240A in the chip mounting area A1, a portion of the photoresist pattern 240P, which is in the chip mounting area A1, has a reduced volume, as compared with the case without the plurality of openings 240A. Therefore, when the photoresist pattern 240P is removed by using the photoresist stripping composition 252, as described with reference to FIG. 2H, a period of time of removing the photoresist pattern 240P may be reduced, and the amount of the photoresist stripping composition 252 used to remove the photoresist pattern 240P may be reduced. In addition, because the center local pattern 242P2 includes the bottom portion BP and the plurality of fin patterns FP extending in the direction away from the plurality of redistribution patterns 234 in the vertical direction (Z direction) from the bottom portion BP, when the photoresist pattern 240P is removed by using the photoresist stripping composition 252, the contact area between the photoresist stripping composition 252 and the photoresist pattern 240P may be significantly increased. Thus, when the photoresist pattern 240P is removed by using the photoresist stripping composition 252, the effect of reducing the period of time of removing the photoresist pattern 240P may be further improved. Therefore, the productivity of a manufacturing process of a semiconductor package may be improved. In addition, while the photoresist pattern 240P is removed by using the photoresist stripping composition 252, a period of time for which metal-containing structures, for example, the plurality of conductive posts 250 and the plurality of lower redistribution patterns 234, are exposed to the photoresist stripping composition 252 may be reduced. As such, because a time period of contact between the metal-containing structures and the photoresist stripping composition 252 is reduced, adverse effects, such as the corrosion of the metal-containing structures, may be prevented, and thus, the reliability of the semiconductor package intended to be manufactured may be improved.

Referring to 2J, a first semiconductor chip 260 may be attached onto the lower redistribution structure 230. The first semiconductor chip 260 may be electrically connected to at least one selected from the plurality of lower redistribution patterns 234 in the lower redistribution structure 230.

The first semiconductor chip 260 may include a first semiconductor device 262 and a plurality of chip pads 264 arranged on one surface of the first semiconductor device 262. The first semiconductor chip 260 may be attached onto the lower redistribution structure 230 such that the plurality of chip pads 264 face toward the lower redistribution structure 230. The plurality of chip pads 264 in the first semiconductor chip 260 may be connected to the plurality of lower redistribution patterns 234 via a plurality of chip connection terminals 266, respectively.

While the first semiconductor chip 260 has been attached onto the lower redistribution structure 230, an underfill material layer 268 may be formed to fill a space between the first semiconductor chip 260 and the lower redistribution structure 230. The underfill material layer 268 may surround the plurality of chip connection terminals 266.

The first semiconductor chip 260 may include a semiconductor substrate. The semiconductor substrate may include a semiconductor element, such as Si or Ge, or a compound semiconductor, such as SiC, GaAs, InAs, or InP. The first semiconductor chip 260 may have an active surface and an inactive surface that is opposite to the active surface. In some embodiments, the active surface of the first semiconductor chip 260 may be arranged to face toward the lower redistribution structure 230. The first semiconductor chip 260 may include a plurality of individual devices of various types.

The first semiconductor chip 260 may be configured to receive at least one of a control signal, a power signal, and a ground signal for operating the first semiconductor chip 260 from the outside thereof, receive a data signal to be stored in the first semiconductor chip 260 from the outside thereof, or provide data stored in the first semiconductor chip 260 to the outside thereof, through the chip connection terminal 266, the lower redistribution structure 230, and the external electrode pad 220.

The chip connection terminal 266 may include a pillar structure, a solder bump, a solder ball, a solder layer, or a combination thereof. The underfill material layer 268 may include an epoxy resin. In some embodiments, the underfill material layer 268 may include a non-conductive film (NCF).

Figure 2J:
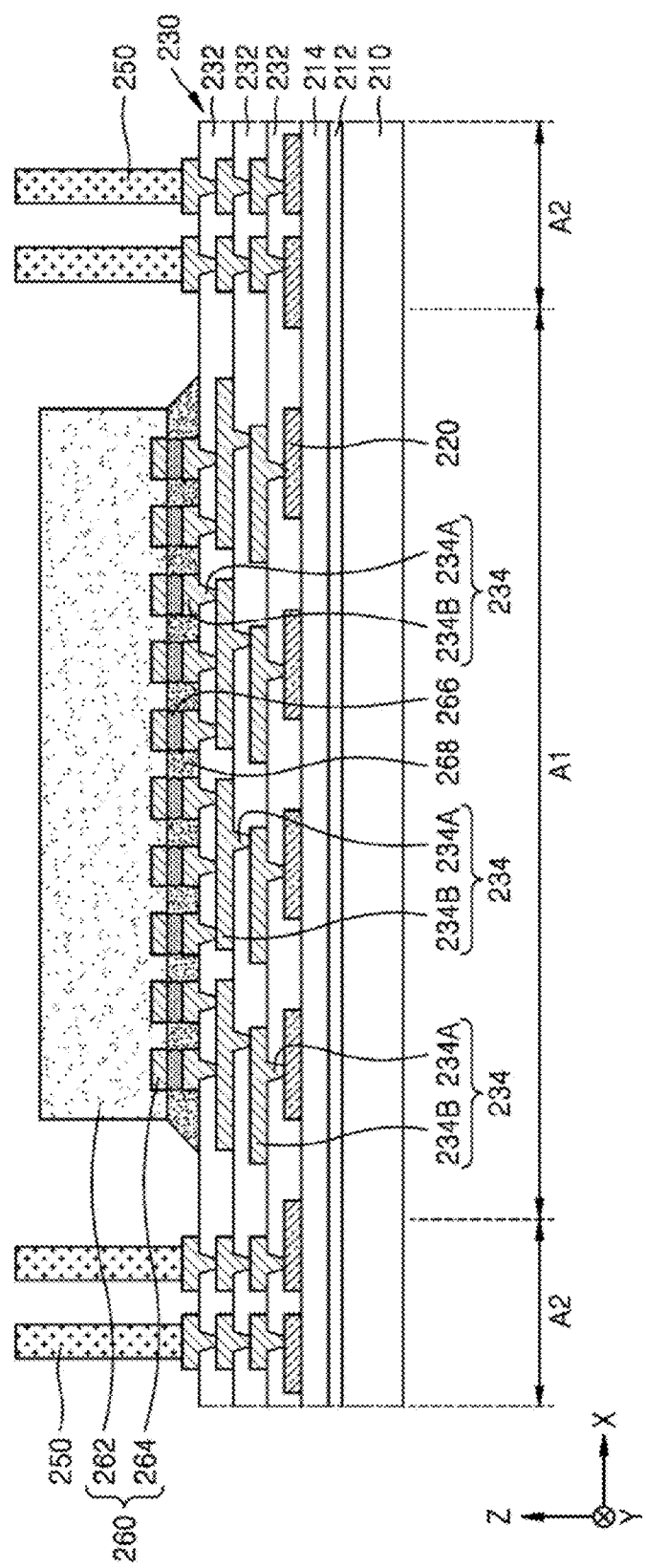
Figure 2K:
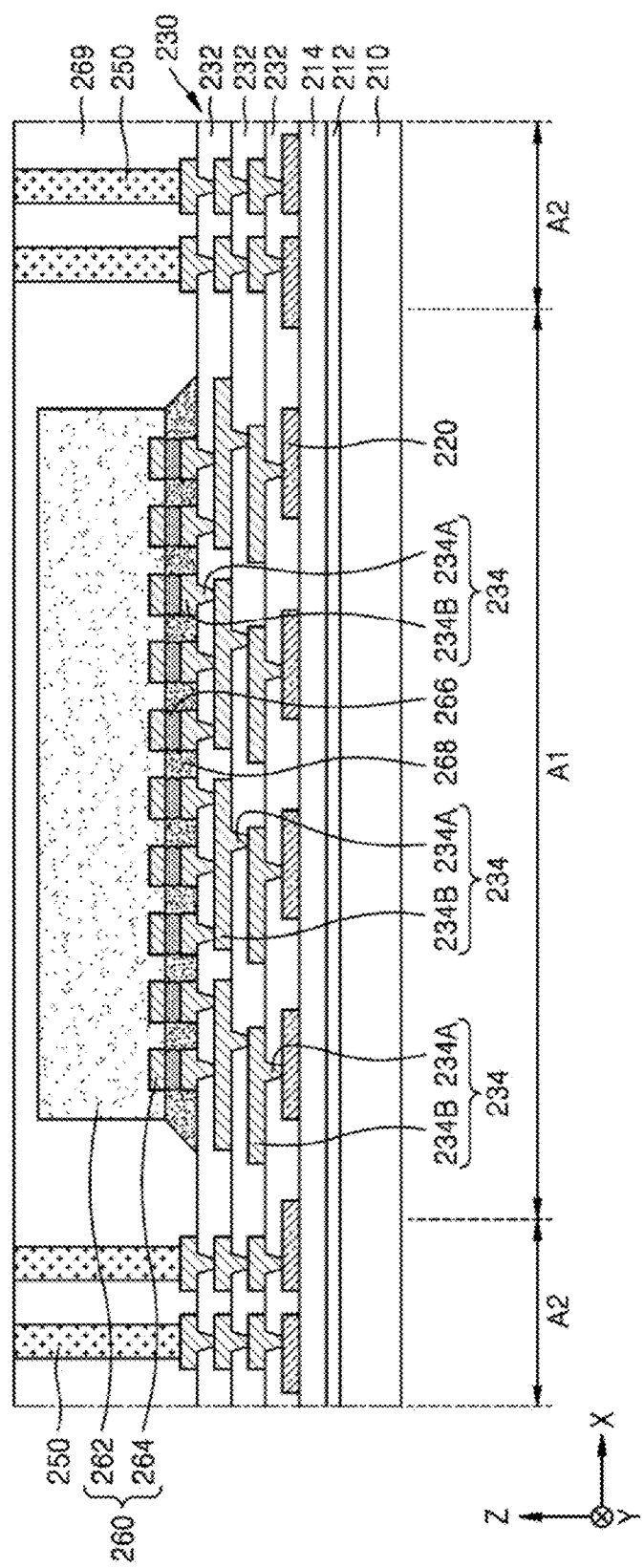
Figure 2L:
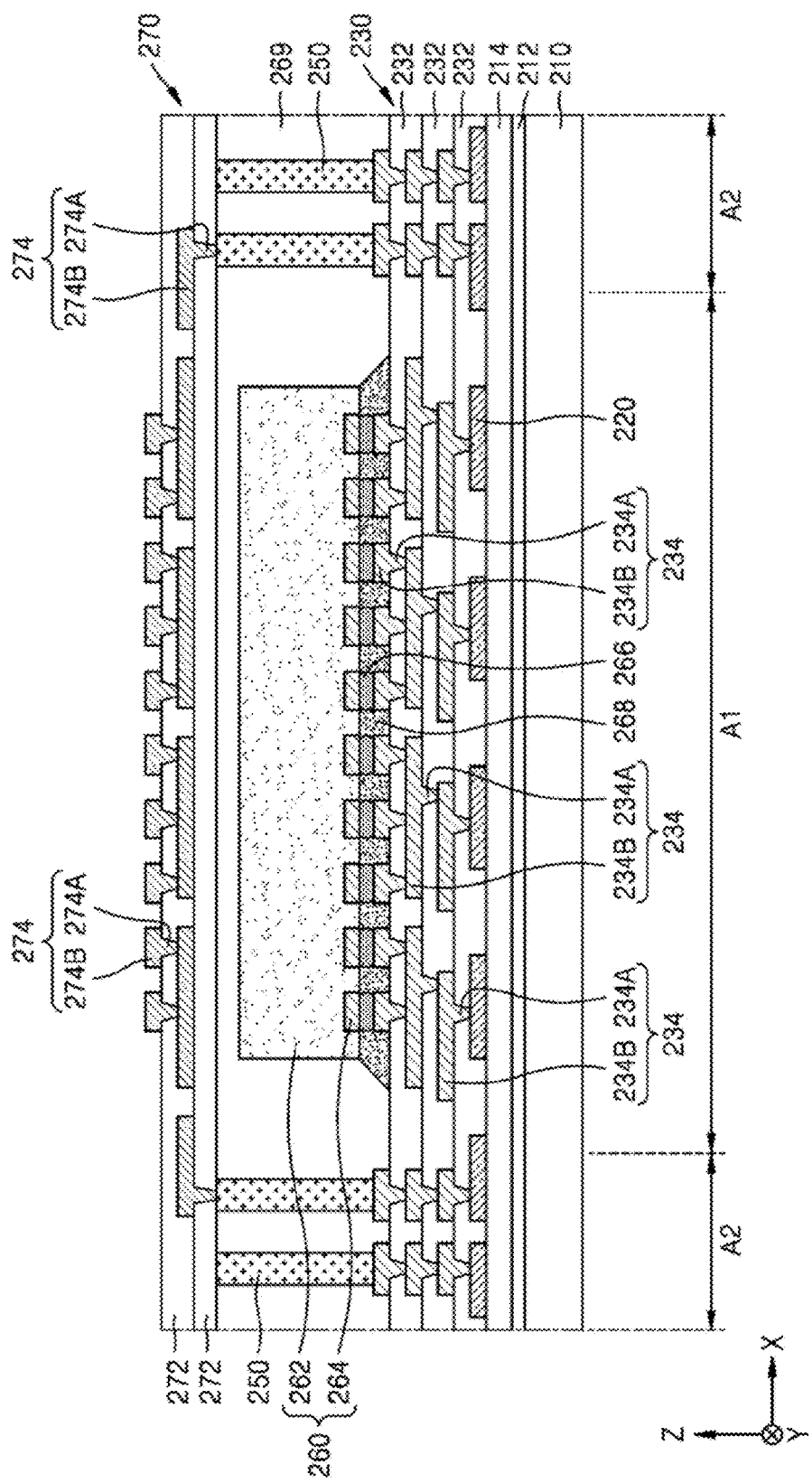

Referring to FIG. 2K, in a resulting product of FIG. 2J, a lower molding layer 269 may be formed to mold the first semiconductor chip 260.

The lower molding layer 269 may be formed to fill spaces between the first semiconductor chip 260 and each of the plurality of conductive posts 250. The lower molding layer 269 may include an epoxy-based material, a thermosetting material, a thermoplastic material, or the like. For example, the lower molding layer 269 may include an epoxy molding compound (EMC). After the lower molding layer 269 is formed, the upper surface of each of the plurality of conductive posts 250 may be exposed.

Referring to 2L, in a resulting product of FIG. 2K, an upper redistribution structure 270 may be formed to cover the plurality of conductive posts 250 and the lower molding layer 269.

The upper redistribution structure 270 may include a plurality of insulating films 272, which are stacked in the vertical direction (Z direction), and a plurality of upper redistribution patterns 274, each passing through one of the plurality of insulating films 272. Each of the plurality of upper redistribution patterns 274 may include a conductive via pattern 274A and a plurality of conductive line patterns 274B. A plurality of conductive via patterns 274A may be respectively connected to some of the plurality of conductive line patterns 274B in the vertical direction. The plurality of conductive via patterns 274A may be insulated from some others of the plurality of conductive line patterns 274B by the plurality of insulating films 272.

In some embodiments, each of the plurality of insulating films 272 may include photosensitive polyimide (PSPI), silicon oxide, or silicon nitride. In some embodiments, each of the plurality of upper redistribution patterns 274 may include copper (Cu), titanium (Ti), titanium tungsten (TiW), titanium nitride (TiN), tantalum (Ta), tantalum nitride (TaN), chromium (Cr), aluminum (Al), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or a combination thereof. In some embodiments, the plurality of upper redistribution patterns 274 may be formed by an electroless plating process, but the disclosure is not limited thereto.

Figure 2M:
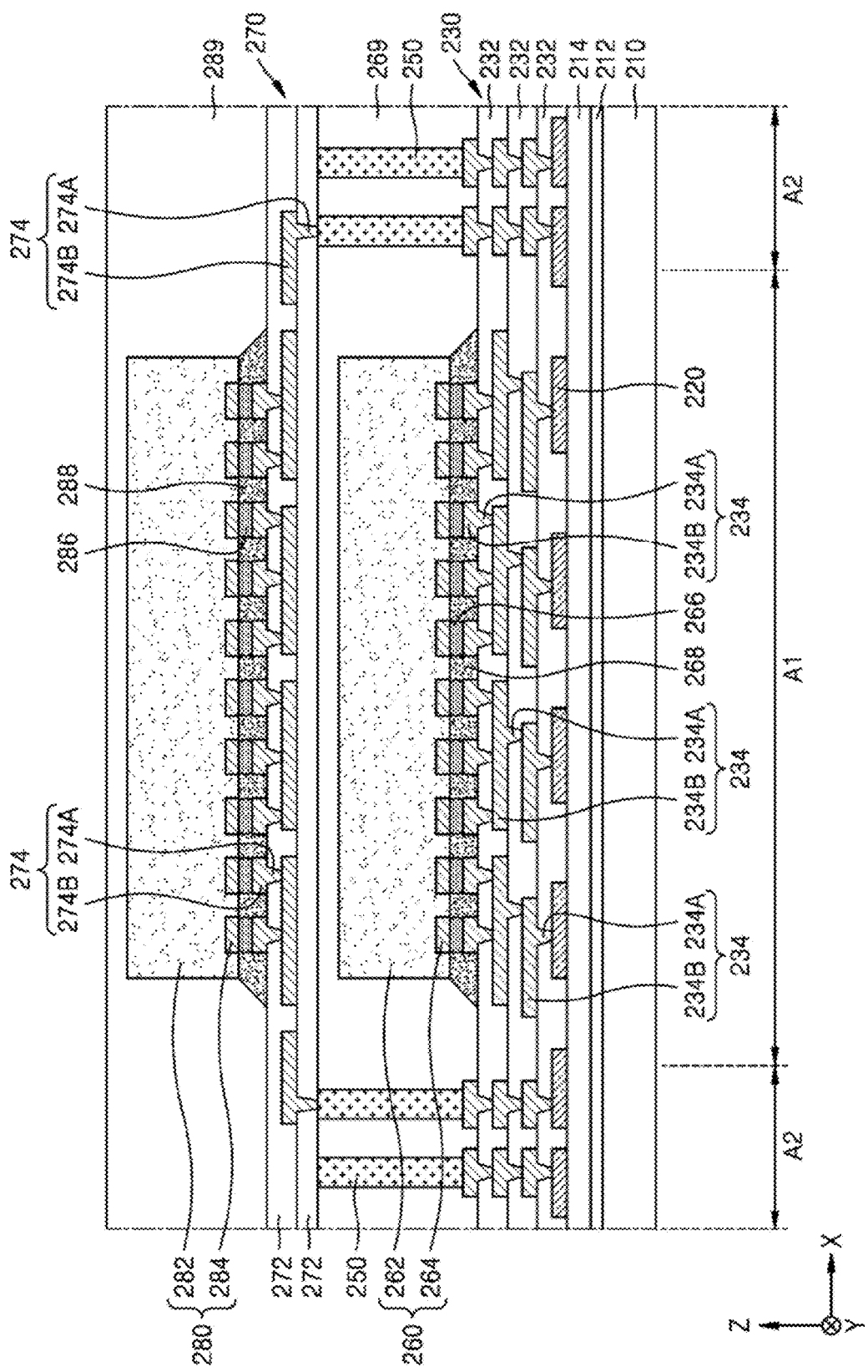
Figure 2N:
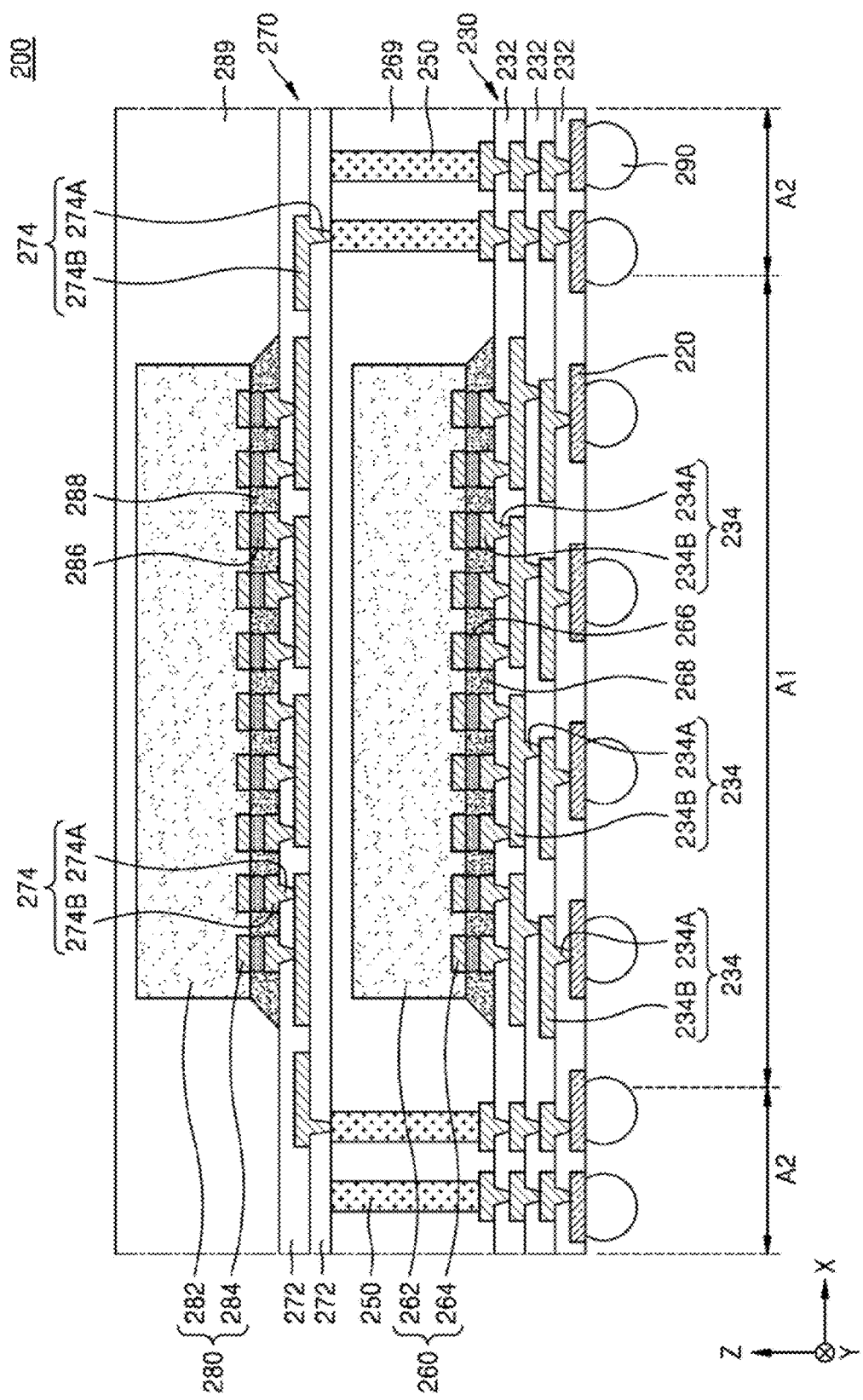

Referring to FIG. 2M, a second semiconductor chip 280 may be attached onto the upper redistribution structure 270. The second semiconductor chip 280 may include a second semiconductor device 282 and a plurality of chip pads 284 arranged on one surface of the second semiconductor device 282. The second semiconductor chip 280 may be attached onto the upper redistribution structure 270 such that the plurality of chip pads 284 face toward the upper redistribution structure 270. The plurality of chip pads 284 in the second semiconductor chip 280 may be connected to the plurality of upper redistribution patterns 274 via a plurality of chip connection terminals 286, respectively.

While the second semiconductor chip 280 has been attached onto the upper redistribution structure 270, an underfill material layer 288 may be formed to fill a space between the second semiconductor chip 280 and the upper redistribution structure 270. The underfill material layer 288 may surround the plurality of chip connection terminals 286. Next, an upper molding layer 289 may be formed to mold the second semiconductor chip 280.

More detailed descriptions of the second semiconductor chip 280, the second semiconductor device 282, the plurality of chip pads 284, the plurality of chip connection terminals 286, and the underfill material layer 288 are substantially the same as the descriptions made regarding the first semiconductor chip 260, the first semiconductor device 262, the plurality of chip pads 264, the plurality of chip connection terminals 266, and the underfill material layer 268 with reference to FIG. 2J, respectively.

In some embodiments, the first semiconductor chip 260 and the second semiconductor chip 280 may respectively include devices performing different functions from each other. For example, the first semiconductor chip 260 may include a logic chip, and the second semiconductor chip 280 may include a memory chip. The logic chip may include a microprocessor. For example, the logic chip may include a central processing unit (CPU), a controller, an application-specific integrated circuit (ASIC), or the like. The memory chip may include a volatile memory chip, such as dynamic random access memory (DRAM) or static random access memory (SRAM), or a nonvolatile memory chip, such as phase-change random access memory (PRAM), magnetoresistive random access memory (MRAM), ferroelectric random access memory (FeRAM), or resistive random access memory (RRAM). In some embodiments, the memory chip may include a high bandwidth memory (HBM) DRAM semiconductor chip.

In some embodiments, the first semiconductor chip 260 and the second semiconductor chip 280 may respectively include devices performing the same function or similar functions to each other. For example, at least one of the first semiconductor chip 260 and the second semiconductor chip 280 may include a system-on-chip (SoC)-type application processor (AP), which is used in a mobile system, for example, a mobile phone, an MP3 player, a navigation system, a portable multimedia player (PMP), or the like, or a double data rate (DDR) synchronous dynamic random access memory (SDRAM) chip used in a mobile system.

Referring to FIG. 2N, the carrier substrate 210, to which the release film 212 is attached, may be separated from a resulting product of FIG. 2M, and the cover layer 214 may be removed, thereby exposing the plurality of external electrode pads 220 and a portion of the insulating film 232.

Next, a plurality of external connection terminals 290 may be respectively attached to a plurality of external electrode pads 150. Each of the plurality of external connection terminals 290 may include a solder ball or bump. Next, a singulation process may be performed on an obtained resulting product, thereby completing an individualized semiconductor package 200.

Figure 4:
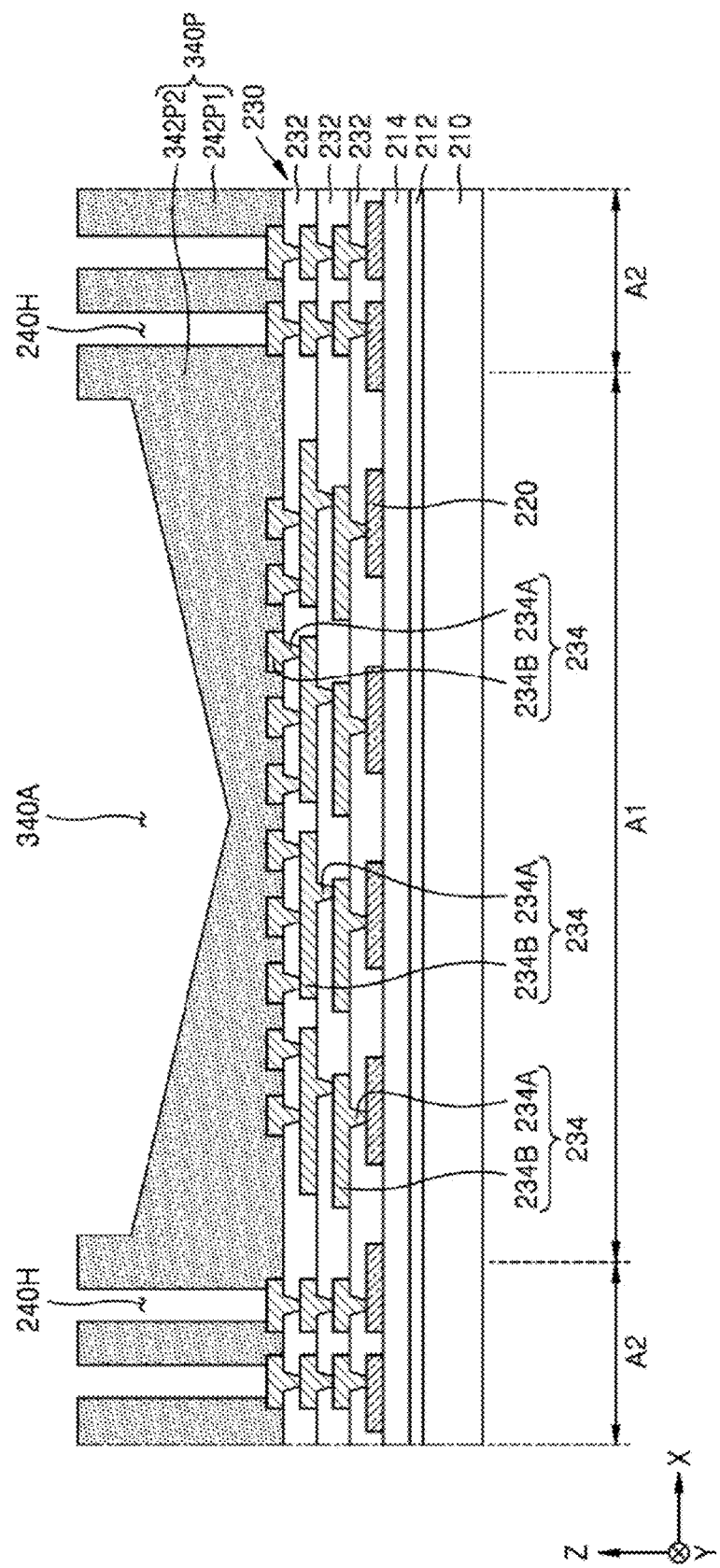
FIG. 4 is a cross-sectional view illustrating a method of manufacturing a semiconductor package, according to at least one embodiment.

FIG. 4 is a cross-sectional view illustrating a method of manufacturing a semiconductor package, according to some embodiments. Regarding FIG. 4, the same reference numerals as in FIGS. 2A to 2N respectively denote the same members, and here, repeated descriptions thereof are omitted.

Referring to FIG. 4, in a similar manner to that described with reference to FIGS. 2A to 2G, up to a process of forming a photoresist pattern 340P on the lower redistribution structure 230 may be performed. However, in an example embodiment, the photoresist pattern 340P may be formed to include the edge local pattern 242P1 and a center local pattern 342P2.

The center local pattern 342P2 may be arranged in the chip mounting area A1 and cover at least one selected from the plurality of lower redistribution patterns 234. A vertical length of the center local pattern 342P2 may be inconsistent toward the center of the chip mounting area A1 from the via hole 240H. For example, the vertical length of the center local pattern 342P2 may gradually decrease toward the center of the chip mounting area A1 from the via hole 240H or from a position near the via hole 240H. In the chip mounting area A1, the center local pattern 342P2 may have a V-shaped upper surface in a cross-sectional view taken along an X-Z plane, as shown in FIG. 4. In the chip mounting area A1, the center local pattern 342P2 may define an opening 340A. A maximum vertical length of the opening 340A may be less than the vertical length of each of the plurality of via holes 240H.

The semiconductor package 200 (see FIG. 2N) may be manufactured by performing the processes described with reference to FIGS. 2G to 2N on a resulting product in which the photoresist pattern 340P is formed.

Figure 5:
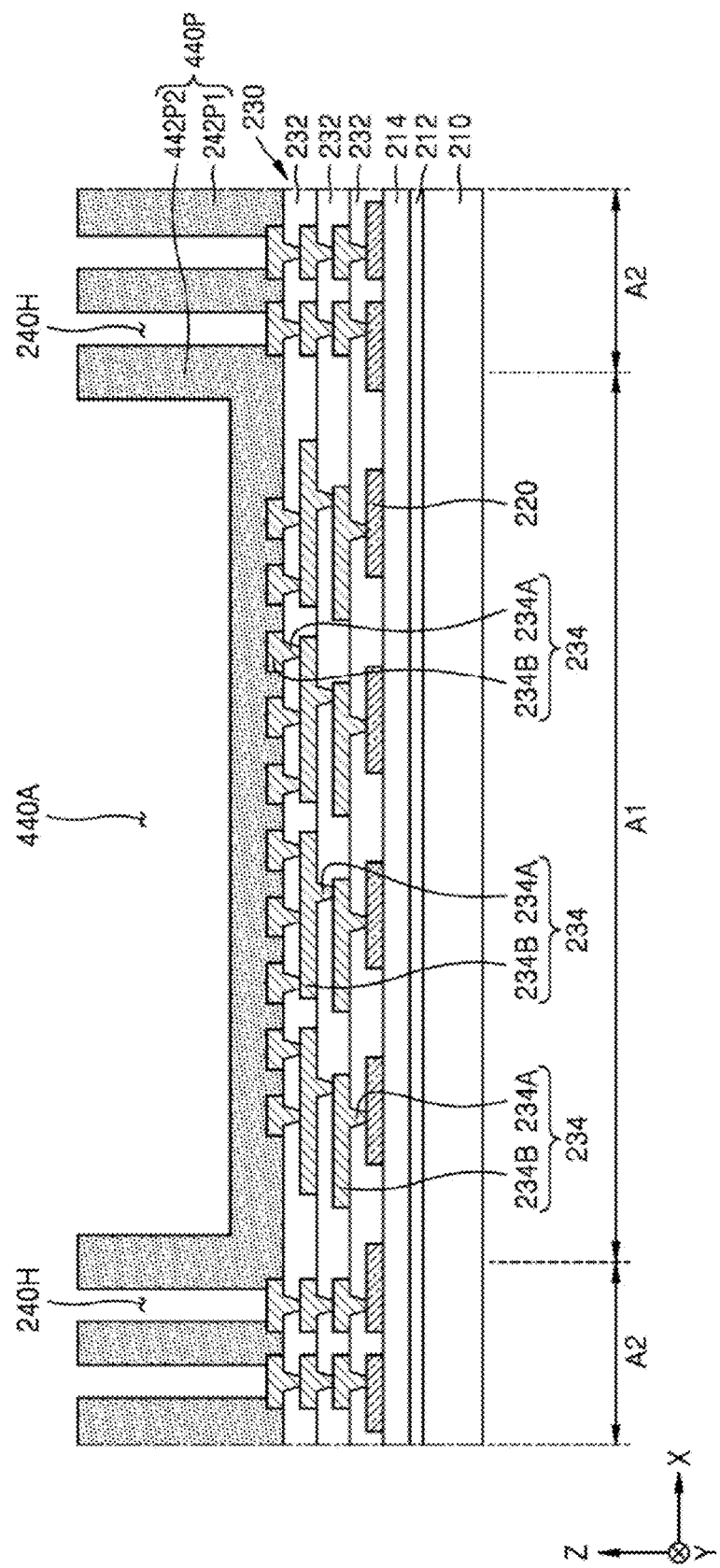
FIG. 5 is a cross-sectional view illustrating a method of manufacturing a semiconductor package, according to at least one embodiment.

FIG. 5 is a cross-sectional view illustrating a method of manufacturing a semiconductor package, according to some embodiments. Regarding FIG. 5, the same reference numerals as in FIGS. 2A to 2N respectively denote the same members, and here, repeated descriptions thereof are omitted.

Referring to FIG. 5, in a similar manner to that described with reference to FIGS. 2A to 2G, up to a process of forming a photoresist pattern 440P on the lower redistribution structure 230 may be performed. However, in an example embodiment, the photoresist pattern 440P may be formed to include the edge local pattern 242P1 and a center local pattern 442P2.

The center local pattern 442P2 may be arranged in the chip mounting area A1 and cover at least one selected from the plurality of lower redistribution patterns 234. A vertical length of the center local pattern 442P2 may be substantially consistent toward the center of the chip mounting area A1 from the via hole 240H or from a position near the via hole 240H. In the chip mounting area A1, the center local pattern 442P2 may have an upper surface extending flat in the horizontal direction in a cross-sectional view taken along the X-Z plane, as shown in FIG. 5. In the chip mounting area A1, the center local pattern 442P2 may define an opening 440A. A maximum vertical length of the opening 440A may be less than the vertical length of each of the plurality of via holes 240H.

The semiconductor package 200 (see FIG. 2N) may be manufactured by performing the processes described with reference to FIGS. 2G to 2N on a resulting product in which the photoresist pattern 440P is formed.

Figure 6:
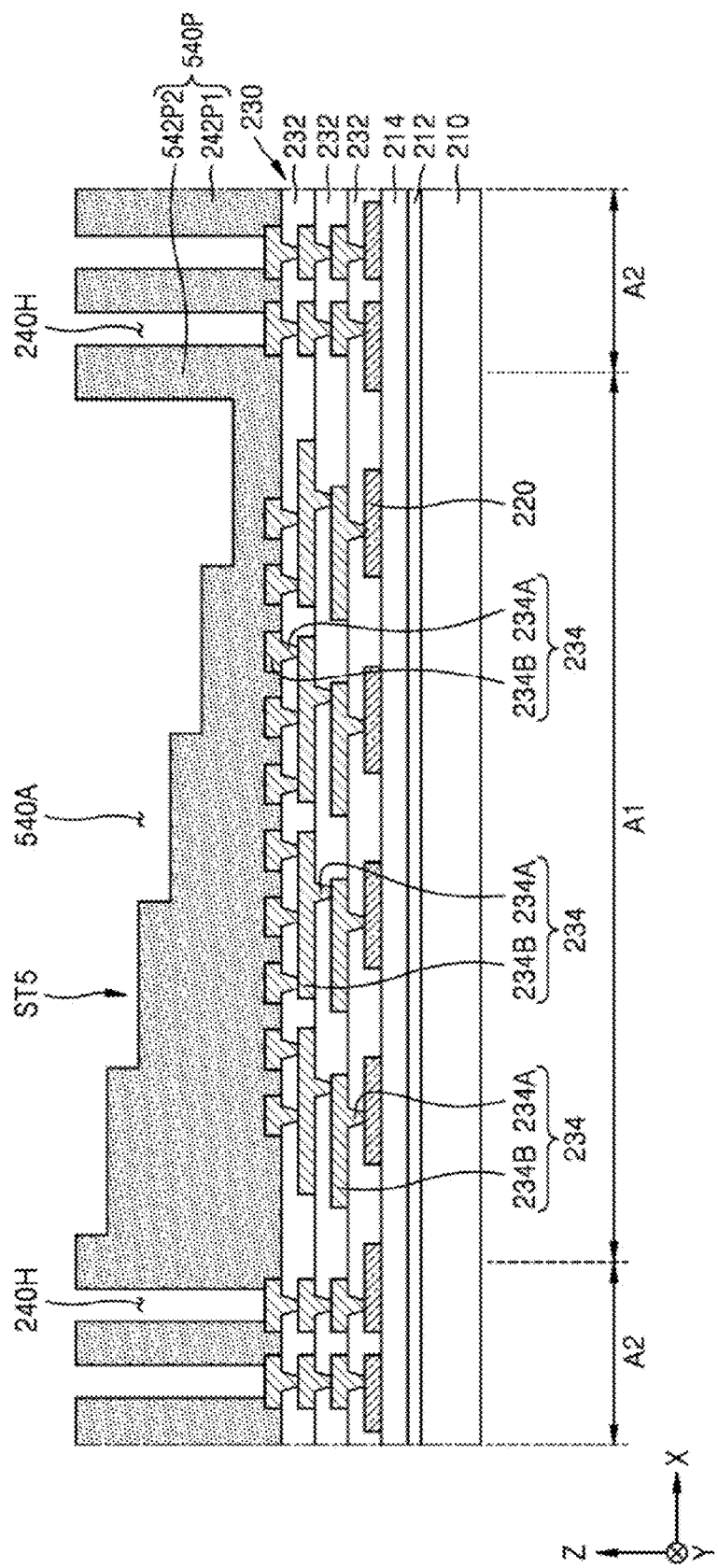
FIG. 6 is a cross-sectional view illustrating a method of manufacturing a semiconductor package, according to at least one embodiment.

FIG. 6 is a cross-sectional view illustrating a method of manufacturing a semiconductor package, according to some embodiments. Regarding FIG. 6, the same reference numerals as in FIGS. 2A to 2N respectively denote the same members, and here, repeated descriptions thereof are omitted.

Referring to FIG. 6, in a similar manner to that described with reference to FIGS. 2A to 2G, up to a process of forming a photoresist pattern 540P on the lower redistribution structure 230 may be performed. However, in an example embodiment, the photoresist pattern 540P may be formed to include the edge local pattern 242P1 and a center local pattern 542P2.

The center local pattern 542P2 may be arranged in the chip mounting area A1 and cover at least one selected from the plurality of lower redistribution patterns 234. A vertical length of the center local pattern 542P2 may be inconsistent toward the center of the chip mounting area A1 from the via hole 240H or from a position near the via hole 240H. The vertical length of the center local pattern 542P2 may be greatest at one side of the chip mounting area A1 in the X direction and may be smallest at the other side in the X direction. In the chip mounting area A1, the center local pattern 542P2 may include a stepwise portion ST5 having a plurality of steps in a cross-sectional view taken along the X-Z plane, as shown in FIG. 6. In the chip mounting area A1, the center local pattern 542P2 may define an opening 540A. A maximum vertical length of the opening 540A may be less than the vertical length of each of the plurality of via holes 240H.

The semiconductor package 200 (see FIG. 2N) may be manufactured by performing the processes described with reference to FIGS. 2G to 2N on a resulting product in which the photoresist pattern 540P is formed.

Figure 7:
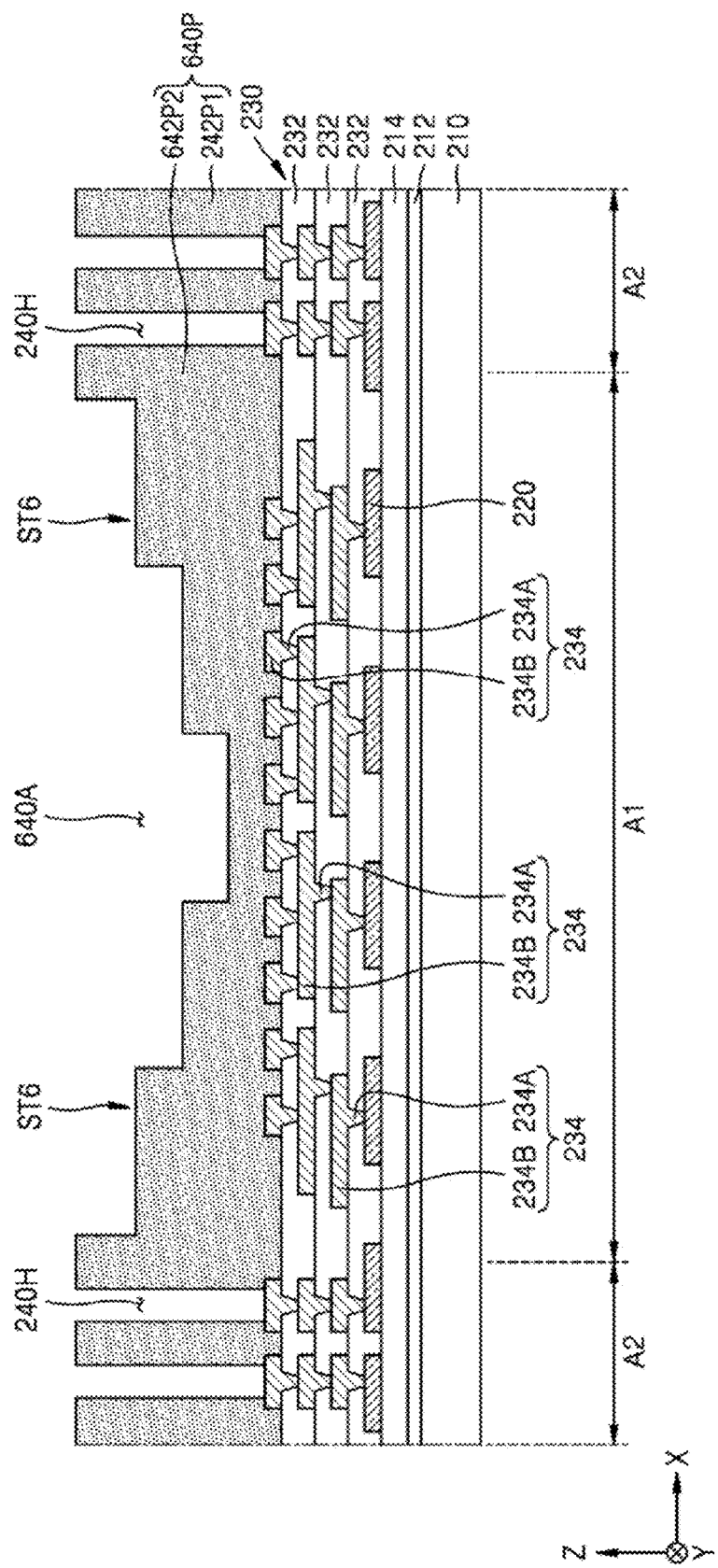
FIG. 7 is a cross-sectional view illustrating a method of manufacturing a semiconductor package, according to at least one embodiment.

FIG. 7 is a cross-sectional view illustrating a method of manufacturing a semiconductor package, according to some embodiments. Regarding FIG. 7, the same reference numerals as in FIGS. 2A to 2N respectively denote the same members, and here, repeated descriptions thereof are omitted.

Referring to FIG. 7, in a similar manner to that described with reference to FIGS. 2A to 2G, up to a process of forming a photoresist pattern 640P on the lower redistribution structure 230 may be performed. However, in an example embodiment, the photoresist pattern 640P may be formed to include the edge local pattern 242P1 and a center local pattern 642P2.

The center local pattern 642P2 may be arranged in the chip mounting area A1 and cover at least one selected from the plurality of lower redistribution patterns 234. A vertical length of the center local pattern 642P2 may be inconsistent toward the center of the chip mounting area A1 from the via hole 240H or from a position near the via hole 240H. The vertical length of the center local pattern 642P2 may gradually decrease toward the center of the chip mounting area A1. In the chip mounting area A1, the center local pattern 642P2 may include a stepwise portion ST6 having a plurality of steps in a cross-sectional view taken along the X-Z plane, as shown in FIG. 7. In the chip mounting area A1, the center local pattern 642P2 may define an opening 640A. A maximum vertical length of the opening 640A may be less than the vertical length of each of the plurality of via holes 240H.

The semiconductor package 200 (see FIG. 2N) may be manufactured by performing the processes described with reference to FIGS. 2G to 2N on a resulting product in which the photoresist pattern 640P is formed.

According to the methods of manufacturing a semiconductor package, described with reference to FIGS. 4 to 7, the same effects as in the method of manufacturing a semiconductor package, described with reference to FIGS. 1 and 2A to 2N, may be obtained.

While the disclosure has been particularly shown and described with reference to embodiments thereof, it will be understood that various changes in form and details may be made therein without departing from the spirit and scope of the following claims.

What is claimed is:

1. A method of manufacturing a semiconductor package, the method comprising:
   forming a plurality of conductive patterns on a substrate;
   forming a photoresist film over the substrate to cover the plurality of conductive patterns;
   forming a photoresist pattern from the photoresist film by a photolithography process using a photomask that comprises a transparent area, a light-shielding area, and a semi-transparent area, wherein the semi-transparent area transmits only a portion of light incident thereon, wherein the photoresist pattern comprises a plurality of local patterns respectively having different vertical heights from each other to define:
   a via hole which exposes one conductive pattern selected from the plurality of conductive patterns, and
   a recessed portion having a lower surface, which exposes a portion of the photoresist pattern under the lower surface;
   forming a conductive post only in the via hole without forming the conductive post in the recessed portion; and
   removing the photoresist pattern by applying a photoresist stripping composition to the photoresist pattern.

2. The method of claim 1, wherein the forming of the photoresist pattern comprises:
   forming an exposed photoresist film by exposing the photoresist film to light by using the photomask, wherein the exposed photoresist film comprises:
   a plurality of local exposed regions,
   a first local non-exposed region extending by a first length in a vertical direction from an upper surface of the exposed photoresist film, and
   a second local non-exposed region extending by a second length, which is less than the first length, in the vertical direction from the upper surface of the exposed photoresist film; and
   removing the first local non-exposed region and the second local non-exposed region by developing the exposed photoresist film.

3. The method of claim 1, wherein the photoresist film is formed in a chip mounting area of the semiconductor package and a connection area of the semiconductor package, the connection area surrounding the chip mounting area, and
   wherein the via hole is formed in the connection area and the recessed portion is formed in the chip mounting area.

4. The method of claim 1, wherein, in the forming of the photoresist pattern, a vertical length of the recessed portion is less than a vertical length of the via hole.

5. The method of claim 1, wherein the photoresist film is formed in a chip mounting area of the semiconductor package and a connection area of the semiconductor package, the connection area surrounding the chip mounting area, and
wherein, in the forming of the photoresist pattern, the plurality of local patterns comprise:
a center local pattern arranged in the chip mounting area and covering at least one selected from the plurality of conductive patterns; and
an edge local pattern arranged in the connection area and defining a width of the via hole in a horizontal direction.

6. The method of claim 1, wherein the photoresist film is formed in a chip mounting area of the semiconductor package and a connection area of the semiconductor package, the connection area surrounding the chip mounting area,
wherein, in the forming of the photoresist pattern, the plurality of local patterns comprise a center local pattern arranged in the chip mounting area, and
wherein the center local pattern comprises:
a bottom portion covering at least one selected from the plurality of conductive patterns; and
a plurality of fin patterns extending in a direction away from the plurality of conductive patterns in a vertical direction from the bottom portion.

7. The method of claim 1, wherein the photoresist film is formed in a chip mounting area of the semiconductor package and a connection area of the semiconductor package, the connection area surrounding the chip mounting area,
wherein, in the forming of the photoresist pattern, the plurality of local patterns comprise a center local pattern arranged in the chip mounting area, and
wherein a vertical length of the center local pattern gradually decreases toward a center of the chip mounting area from the via hole.

8. The method of claim 1, wherein the photoresist film is formed in a chip mounting area of the semiconductor package and a connection area of the semiconductor package, the connection area surrounding the chip mounting area,
wherein, in the forming of the photoresist pattern, the plurality of local patterns comprise a center local pattern arranged in the chip mounting area, and
wherein a vertical length of the center local pattern is not constant toward a center of the chip mounting area from the via hole.

9. The method of claim 1, wherein the photoresist film is formed in a chip mounting area of the semiconductor package and a connection area of the semiconductor package, the connection area surrounding the chip mounting area,
wherein, in the forming of the photoresist pattern, the plurality of local patterns comprise a center local pattern arranged in the chip mounting area, and
wherein the center local pattern comprises a stepwise portion having a plurality of steps.

10. The method of claim 1, wherein the photoresist film comprises a negative-type photoresist film.

11. The method of claim 1, wherein the photoresist pattern has a first thickness selected from within a range of about 50 μm to about 400 μm, and
wherein the portion of the photoresist pattern, which is exposed by the lower surface of the recessed portion, has a second thickness that is less than the first thickness of the photoresist pattern.

12. A method of manufacturing a semiconductor package, the method comprising:
preparing a substrate that extends in a horizontal direction and comprises a chip mounting area and a connection area surrounding the chip mounting area;
forming a plurality of conductive patterns on the substrate in the chip mounting area and the connection area;
forming a photoresist film to cover the plurality of conductive patterns in the chip mounting area and the connection area;
forming a photoresist pattern from the photoresist film by a photolithography process using a photomask that comprises a plurality of transparent areas, a plurality of light-shielding areas, and at least one semi-transparent area, wherein the at least one semi-transparent area transmits only a portion of light incident thereon, wherein the photoresist pattern comprises a plurality of local patterns respectively having different vertical heights from each other to define:
a plurality of via holes, which are arranged in the connection area and each expose one conductive pattern from among the plurality of conductive patterns, and
at least one recessed portion, which is arranged in the chip mounting area and has a lower surface that exposes a portion of the photoresist pattern under the lower surface;
forming a plurality of conductive posts respectively only in the plurality of via holes without forming a conductive post in the at least one recessed portion; and
removing the photoresist pattern by applying a photoresist stripping composition to the photoresist pattern.

13. The method of claim 12, wherein the forming of the photoresist pattern comprises exposing the photoresist film to light by using the photomask,
wherein, in the exposing of the photoresist film to the light, the photoresist film in the chip mounting area is exposed to light passing through the at least one semi-transparent area and through at least one from among the plurality of transparent areas, and
wherein, in the exposing of the photoresist film to the light, the photoresist film in the connection area is exposed to light passing through at least one from among the plurality of transparent areas.

14. The method of claim 12, wherein the forming of the photoresist pattern comprises exposing the photoresist film to light by using the photomask,
wherein, in the exposing of the photoresist film to the light, the plurality of light-shielding areas of the photomask are aligned with a portion of the photoresist film, which is in the connection area, and
wherein, in the exposing of the photoresist film to the light, the at least one semi-transparent area in the photomask is aligned with another portion of the photoresist film, which is in the chip mounting area.

15. The method of claim 12, wherein the forming of the photoresist pattern comprises:
forming an exposed photoresist film by exposing the photoresist film to light by using the photomask, wherein the exposed photoresist film comprises:
a plurality of local exposed regions arranged in the chip mounting area and the connection area, a first local non-exposed region extending by a first length in a vertical direction from an upper surface of the exposed photoresist film in the connection area, and a second local non-exposed region extending by a second length, which is less than the first length, in the vertical direction from the upper surface of the exposed photoresist film in the chip mounting area; and removing the first local non-exposed region and the second local non-exposed region by developing the exposed photoresist film.

16. The method of claim 12, wherein, in the forming of the photoresist pattern, the plurality of local patterns comprises a center local pattern arranged in the chip mounting area and covering at least one selected from the plurality of conductive patterns, and wherein the center local pattern comprises:
a bottom portion covering at least one selected from the plurality of conductive patterns; and
a plurality of fin patterns extending in a direction away from the plurality of conductive patterns in a vertical direction from the bottom portion.

17. The method of claim 12, wherein, in the forming of the photoresist pattern, the plurality of local patterns comprises a center local pattern arranged in the chip mounting area, and
wherein a vertical length of the center local pattern gradually decreases toward a center of the chip mounting area from the via hole.

18. The method of claim 12, wherein, in the forming of the photoresist pattern, the plurality of local patterns comprises a center local pattern arranged in the chip mounting area, and
wherein the center local pattern comprises a stepwise portion having a plurality of steps.

19. A method of manufacturing a semiconductor package, the method comprising:
preparing a substrate that extends in a horizontal direction and comprises a chip mounting area and a connection area surrounding the chip mounting area;
forming a redistribution layer on the substrate in the chip mounting area and the connection area, the redistribution layer comprising a plurality of conductive patterns;
forming a photoresist film on the redistribution layer in the chip mounting area and the connection area to cover the plurality of conductive patterns, the photoresist film comprising a negative-type photoresist;
forming a photoresist pattern from the photoresist film by a photolithography process using a photomask that comprises a plurality of transparent areas, a plurality of light-shielding areas, and at least one semi-transparent area, wherein the at least one semi-transparent area transmits only a portion of light incident thereon, wherein the photoresist pattern comprises a plurality of local patterns respectively having different vertical heights from each other to define:
a plurality of via holes, which are arranged in the connection area and each expose one conductive pattern from among the plurality of conductive patterns, and
at least one recessed portion, which is arranged in the chip mounting area and has a lower surface that exposes a portion of the photoresist pattern under the lower surface;
forming a plurality of conductive posts respectively only in the plurality of via holes without forming a conductive post in the at least one recessed portion;
exposing at least one conductive pattern from among the plurality of conductive patterns in the chip mounting area by removing the photoresist pattern by applying a photoresist stripping composition to the photoresist pattern; and
mounting a semiconductor chip on the redistribution layer in the chip mounting area such that the semiconductor chip is electrically connected to the at least one conductive pattern.

20. The method of claim 19, wherein, in the forming of the photoresist pattern, the photoresist pattern has a first thickness selected from within a range of about 50 μm to about 400 μm,
wherein, in the forming of the photoresist pattern, the plurality of local patterns comprise a center local pattern arranged in the chip mounting area, and
wherein the center local pattern comprises a portion having a second thickness that is less than the first thickness of the photoresist pattern.

* * * * *